(12) United States Patent
Ono et al.

(10) Patent No.: US 8,173,478 B2
(45) Date of Patent: May 8, 2012

(54) METHOD OF MANUFACTURING METAL WIRING AND METHOD OF MANUFACTURING SEMICONDUCTOR DEVICE

(75) Inventors: Koji Ono, Kanagawa (JP); Hideomi Suzawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 11 days.

(21) Appl. No.: 12/357,533

(22) Filed: Jan. 22, 2009

(65) Prior Publication Data

US 2009/0148963 A1 Jun. 11, 2009

Related U.S. Application Data

(62) Division of application No. 11/105,917, filed on Apr. 14, 2005, now Pat. No. 7,482,274, which is a division of application No. 10/205,976, filed on Jul. 26, 2002, now abandoned.

(30) Foreign Application Priority Data

Jul. 27, 2001  (JP) ................................ 2001-227047

(51) Int. Cl.
  *H01L 21/00*  (2006.01)
(52) U.S. Cl. .............. 438/66; 438/73; 438/80; 438/149; 438/164; 257/59; 257/79; 257/291; 257/292; 257/443
(58) Field of Classification Search .................. 438/149, 438/517, 689, 709, 713, 154, 478, 486, 197, 438/164, 48, 66, 67, 73, 80; 257/57, 347, 257/408, 353, 344, 311, 223, 227, 291, 292, 257/438, 443, 655, 79, 59, 40
See application file for complete search history.

(56) References Cited

U.S. PATENT DOCUMENTS

| 4,233,109 A | 11/1980 | Nishizawa |
| 4,885,074 A | 12/1989 | Susko et al. |
| 5,185,058 A | 2/1993 | Cathey, Jr. |
| 5,302,240 A | 4/1994 | Hori et al. |

(Continued)

FOREIGN PATENT DOCUMENTS

EP        0 680 079 A2   11/1995

(Continued)

OTHER PUBLICATIONS

El-Kareh, B., *Fundamentals of Semiconductor Processing Technologies*, Kluwer Academic Publishers, 1998, p. 285.

(Continued)

*Primary Examiner* — Ha Tran T Nguyen
*Assistant Examiner* — Thanh Y Tran
(74) *Attorney, Agent, or Firm* — Husch Blackwell LLP

(57) ABSTRACT

A metal wiring suitable for a substrate of large size is provided. The present invention is characterized in that at least one layer of conductive film is formed on an insulating surface, a resist pattern is formed on the conductive film, and the conductive film having the resist pattern is etched to form a metal wiring while controlling its taper angle $\alpha$ in accordance with the bias power density, the ICP power density, the temperature of lower electrode, the pressure, the total flow rate of etching gas, or the ratio of oxygen or chlorine in etching gas. The thus formed metal wiring has less fluctuation in width or length and can satisfactorily deal with an increase in size of substrate.

22 Claims, 27 Drawing Sheets

U.S. PATENT DOCUMENTS

| | | | |
|---|---|---|---|
| 5,378,309 A | 1/1995 | Rabinzohn | |
| 5,633,738 A | 5/1997 | Wakui et al. | |
| 5,643,826 A | 7/1997 | Ohtani et al. | |
| 5,716,534 A | 2/1998 | Tsuchiya et al. | |
| 5,811,835 A | 9/1998 | Seiki et al. | |
| 5,824,606 A | 10/1998 | Dible et al. | |
| 5,883,007 A | 3/1999 | Abraham et al. | |
| 5,917,199 A | 6/1999 | Byun et al. | |
| 5,923,962 A | 7/1999 | Ohtani et al. | |
| 5,923,999 A | 7/1999 | Balasubramanyam et al. | |
| 5,981,149 A | 11/1999 | Yamaguchi | |
| 6,093,457 A | 7/2000 | Okumura et al. | |
| 6,218,221 B1 | 4/2001 | Sah | |
| 6,232,209 B1 | 5/2001 | Fujiwara et al. | |
| 6,239,403 B1 | 5/2001 | Dible et al. | |
| 6,259,106 B1 | 7/2001 | Boegli et al. | |
| 6,357,385 B1 | 3/2002 | Ohmi et al. | |
| 6,365,917 B1 | 4/2002 | Yamazaki | |
| 6,407,004 B1 | 6/2002 | Kimura et al. | |
| 6,423,242 B1 | 7/2002 | Kojima et al. | |
| 6,431,112 B1 | 8/2002 | Sill et al. | |
| 6,475,836 B1 | 11/2002 | Suzawa et al. | |
| 6,515,336 B1 | 2/2003 | Suzawa et al. | |
| 6,534,789 B2 | 3/2003 | Ishida | |
| 6,541,294 B1 | 4/2003 | Yamazaki et al. | |
| 6,556,702 B1 | 4/2003 | Rishton et al. | |
| 6,596,571 B2 | 7/2003 | Arao et al. | |
| 6,627,996 B1 * | 9/2003 | Yokoyama et al. | 257/758 |
| 6,646,287 B1 | 11/2003 | Ono et al. | |
| 6,657,260 B2 | 12/2003 | Yamazaki et al. | |
| 6,664,145 B1 | 12/2003 | Yamazaki et al. | |
| 6,743,649 B2 | 6/2004 | Yamazaki et al. | |
| 6,747,289 B2 | 6/2004 | Yamazaki et al. | |
| 6,759,678 B2 | 7/2004 | Yamazaki et al. | |
| 6,773,996 B2 | 8/2004 | Suzawa et al. | |
| 6,809,339 B2 | 10/2004 | Suzawa et al. | |
| 6,872,604 B2 | 3/2005 | Yamazaki et al. | |
| 6,909,114 B1 * | 6/2005 | Yamazaki | 257/66 |
| 6,930,047 B2 | 8/2005 | Yamazaki et al. | |
| 6,933,565 B2 * | 8/2005 | Matsumoto et al. | 257/347 |
| 7,078,321 B2 * | 7/2006 | Yoshimoto | 438/486 |
| 7,172,928 B2 * | 2/2007 | Yamazaki | 438/149 |
| 7,439,543 B2 * | 10/2008 | Yamazaki | 257/66 |
| 7,482,274 B2 * | 1/2009 | Ono et al. | 438/689 |
| 2001/0030322 A1 | 10/2001 | Yamazaki et al. | |
| 2001/0035526 A1 | 11/2001 | Yamazaki et al. | |
| 2001/0041392 A1 | 11/2001 | Suzawa et al. | |
| 2001/0049197 A1 | 12/2001 | Yamazaki et al. | |
| 2001/0052950 A1 | 12/2001 | Yamazaki et al. | |
| 2001/0055841 A1 | 12/2001 | Yamazaki et al. | |
| 2002/0000551 A1 | 1/2002 | Yamazaki et al. | |
| 2002/0006705 A1 | 1/2002 | Suzawa et al. | |
| 2002/0013022 A1 | 1/2002 | Yamazaki et al. | |
| 2002/0016028 A1 | 2/2002 | Arao et al. | |
| 2002/0017685 A1 | 2/2002 | Kasahara et al. | |
| 2002/0110941 A1 | 8/2002 | Yamazaki et al. | |
| 2002/0125213 A1 | 9/2002 | Yamazaki et al. | |
| 2002/0145141 A1 | 10/2002 | Chen | |
| 2002/0158288 A1 | 10/2002 | Yamazaki et al. | |
| 2002/0163049 A1 | 11/2002 | Yamazaki et al. | |
| 2003/0054653 A1 | 3/2003 | Yamazaki et al. | |
| 2003/0094614 A1 | 5/2003 | Yamazaki et al. | |
| 2003/0116805 A1 | 6/2003 | Suzawa et al. | |
| 2003/0180996 A1 | 9/2003 | Yamazaki et al. | |
| 2004/0018670 A1 | 1/2004 | Arao et al. | |
| 2004/0053451 A1 | 3/2004 | Ono et al. | |
| 2004/0065883 A1 | 4/2004 | Yamazaki et al. | |
| 2004/0084699 A1 | 5/2004 | Yamazaki et al. | |
| 2004/0192004 A1 | 9/2004 | Yamazaki et al. | |
| 2004/0195590 A1 | 10/2004 | Suzawa et al. | |
| 2004/0224486 A1 | 11/2004 | Ichijo et al. | |
| 2005/0040403 A1 | 2/2005 | Suzawa et al. | |
| 2005/0056934 A1 | 3/2005 | Suzawa et al. | |
| 2005/0142818 A1 | 6/2005 | Nakamura et al. | |
| 2005/0158930 A1 | 7/2005 | Yamazaki et al. | |
| 2005/0202602 A1 | 9/2005 | Asami et al. | |
| 2005/0266593 A1 | 12/2005 | Suzawa et al. | |
| 2006/0048894 A1 | 3/2006 | Yamazaki et al. | |

FOREIGN PATENT DOCUMENTS

| | | |
|---|---|---|
| EP | 0 909 972 A2 | 4/1999 |
| EP | 1 071 124 A2 | 1/2001 |
| EP | 1 132 960 A2 | 9/2001 |
| EP | 1 237 195 A2 | 9/2002 |
| JP | 1-207973 | 8/1989 |
| JP | 7-130652 | 5/1995 |
| JP | 7-202047 | 8/1995 |
| JP | 9-260356 | 10/1997 |
| JP | 9-279367 | 10/1997 |
| JP | 10-233511 | 9/1998 |
| JP | 10-326772 | 12/1998 |
| JP | 11-87726 | 3/1999 |
| JP | 2000-353804 | 12/2000 |
| JP | 2001-35808 | 2/2001 |

OTHER PUBLICATIONS

U.S. Appl. No. 09/615,449 (abandoned) to Suzawa et al filed Jul. 13, 2000, including specification, abstract, claims, drawings and PTO Notice of Abandonment.

* cited by examiner

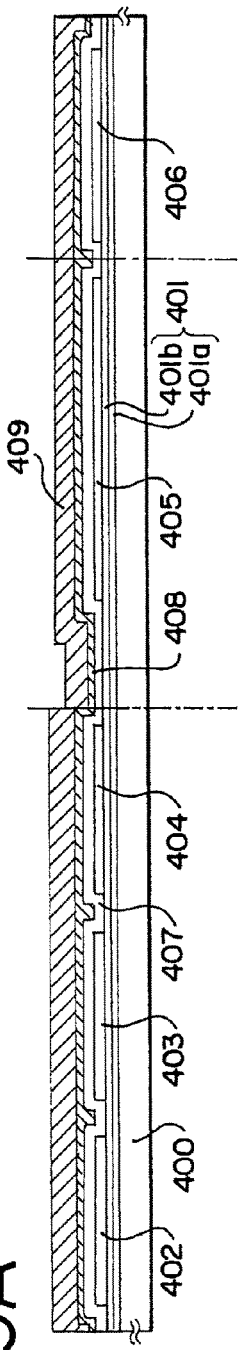
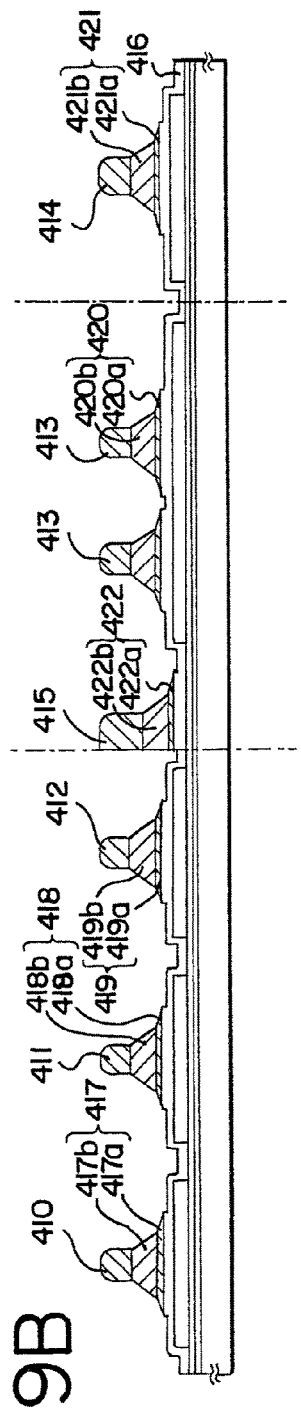
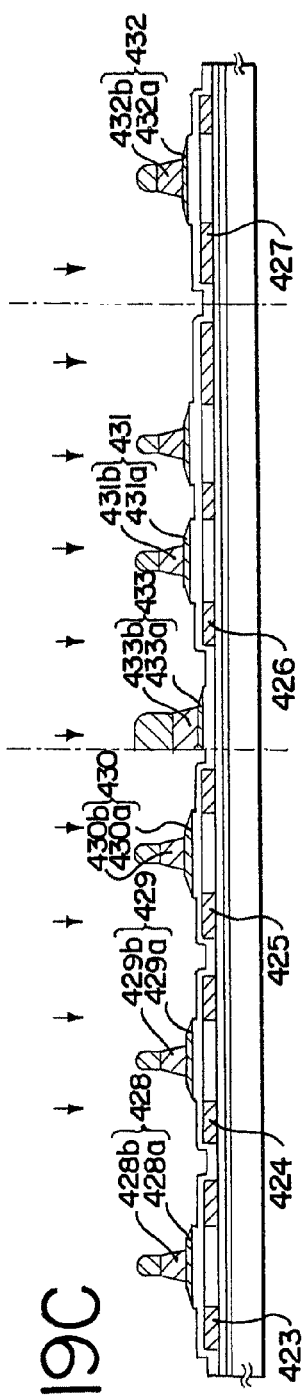
FIG. 19A
FIG. 19B
FIG. 19C

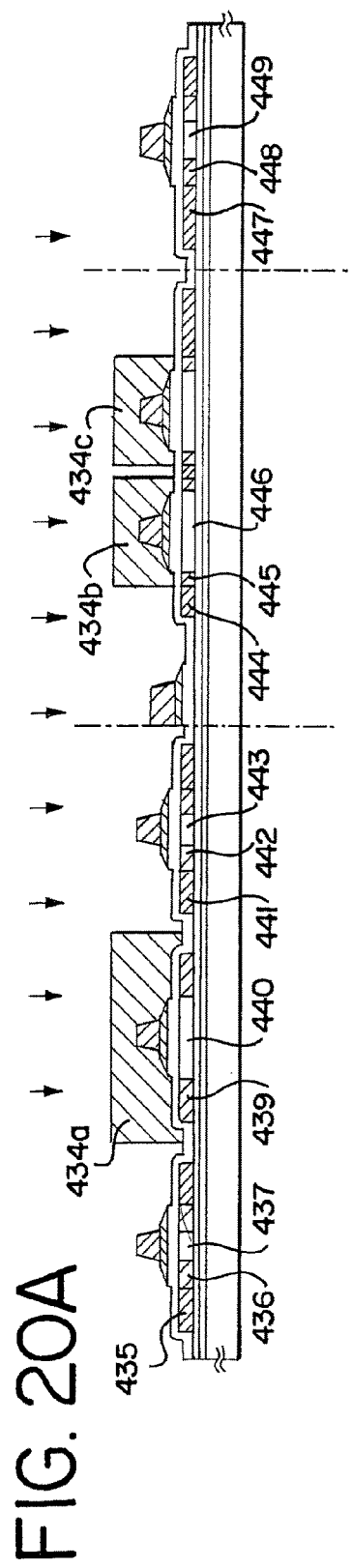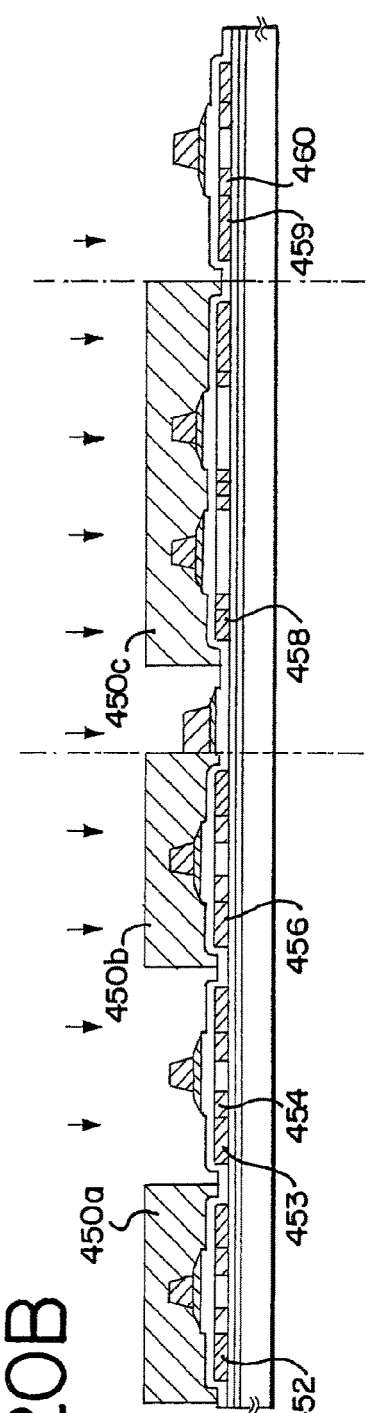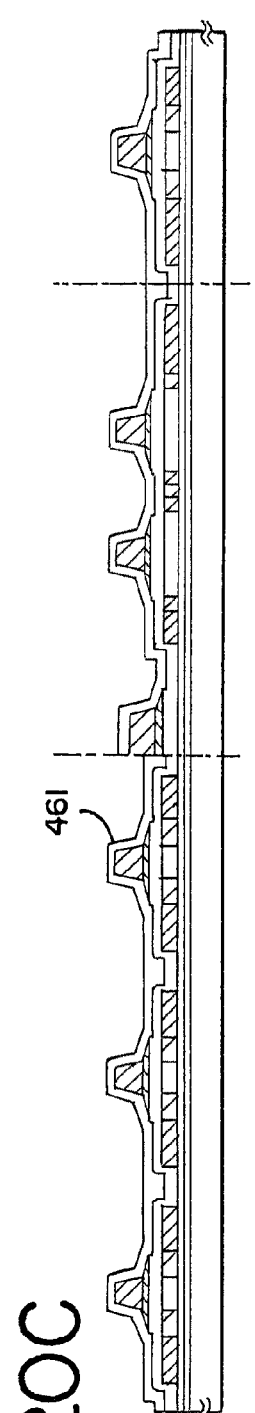

METHOD OF MANUFACTURING METAL WIRING AND METHOD OF MANUFACTURING SEMICONDUCTOR DEVICE

This application is a divisional of U.S. application Ser. No. 11/105,917 filed on Apr. 14, 2005 now U.S. Pat. No. 7,482,274 which is a divisional of U.S. application Ser. No. 10/205,976 filed on Jul. 26, 2002 (now abandoned).

BACKGROUND OF THE INVENTION

1. Field of the Invention

The present invention relates to a metal wiring and its manufacturing method using a thin film technology. Further, the invention relates to a metal wiring substrate (a substrate having metal wirings thereon) and its manufacturing method.

2. Description of the Related Art

In recent years, a development of a semiconductor device having a large area integrated circuit comprising thin film transistors (TFTs) is progressing, the TFT being formed by using a semiconductor thin film (several to several hundreds of nm in thickness) deposited over a substrate with an insulating surface. An active matrix liquid crystal display device, a light emitting device, and a close contact type image sensor are known as typical examples. In particular, since the TFT using a crystalline silicon film (typically, a polysilicon film) as an active region (hereinafter referred to as polysilicon TFT) has a high field effect mobility, it can be also used for forming various functional circuits.

For example, in the active matrix liquid crystal display device, there are formed on a single substrate, at least a pixel portion for performing image display on respective functional blocks and driver circuits such as a shift register circuit, a level shifter circuit, a buffer circuit, a sampling circuit, and the like, which are based on a CMOS circuit for controlling the pixel portion.

In the pixel portion of the active matrix liquid crystal display device, a plurality of TFTs (pixel TFTs) are disposed at several hundred thousands to several millions of pixels, respectively, and pixel electrodes are provided to the pixel TFTs, respectively. A counter electrode is provided on the side of an opposing substrate, the substrate and the opposing substrate interposing liquid crystal therebetween. Thus, a portion functioning as a capacitor which uses the liquid crystal as a dielectric is formed. Then, a voltage applied to each pixel is controlled by a switching operation of the TFT to control a charge of the capacitor, whereby the liquid crystal is driven. As a result, it is constructed such that an image is displayed by controlling an amount of transmission light.

The pixel TFT is generally of an n-channel type, and is used as a switching element for applying a voltage to the liquid crystal and driving it. Since the liquid crystal is driven by an alternating current, a system called a frame inversion drive is employed in many cases. In this system, in order to keep consumption power low, it is important that an off-current value (drain current flowing when the TFT is in an off-operation) is sufficiently kept low as a characteristic required for the pixel TFT.

A low concentration drain (lightly doped drain (LDD)) structure is known as a TFT structure for reducing the off-current value. This structure is made by providing a region, to which an impurity element is added at a low concentration, between a channel forming region and a source region or a drain region, to which the impurity element is added at a high concentration, and this region is referred to as an LDD region. Further, a so-called GOLD (gate-drain overlapped LDD) structure in which the LDD region is disposed so as to overlap a gate electrode through a gate insulating film is known as means for preventing a reduction in an on-current value due to a hot carrier. It is known that such a structure mitigates a high electric field near the drain region to prevent a hot carrier injection and is therefore effective to prevent a degradation phenomenon.

A brief description is given below on how the GOLD structure is obtained. A base insulating film is formed on a substrate, a semiconductor film is formed on the base insulating film, an insulating film is formed on the semiconductor film, and a conductive film is formed on the insulating film. Subsequently, resist is formed and the conductive film is etched so that the conductive film is tapered around the edges. Desirably, a dry etching method using high-density plasma is employed in this etching. A measure suitable to obtain high-density plasma is etching apparatus that uses microwave or inductively coupled plasma (ICP). Then a low concentration impurity region that overlaps a gate electrode and a high concentration impurity region that functions as a source region or a drain region are formed in the semiconductor film through first doping treatment and second doping treatment. The GOLD structure is obtained by the above processing.

Etching conditions in ICP etching apparatus include the bias power density, the ICP power density, the pressure, the total flow rate of etching gas, and the temperature of lower electrode. The ratio of oxygen added to etching gas also constitutes the etching conditions since etching of the resist is accelerated when oxygen is added to etching gas.

The selective ratio between the resist and the conductive film varies depending on how the etching conditions are set and, in some cases, the width of conductive film fluctuates throughout the substrate surface when the conductive film is processed so as to have its edges tapered. If the GOLD structure is obtained by utilizing a conductive film tapered by etching as described above, the conductive film serves as a mask for introducing an impurity element and therefore the fluctuation in width of conductive film causes fluctuation in channel length and in length of a region where the conductive film overlaps an LDD region. Accordingly, fluctuated width of conductive film causes fluctuation in electric characteristics such as ON current and OFF current between TFTs. Furthermore, the fluctuation in width of conductive film leads to fluctuation in wiring resistance if the conductive film is used as a wiring. The problem of fluctuation in width or length of conductive film becomes increasingly serious as the substrate is increased in size. To avoid fluctuation in width or length of conductive film for enhanced uniformity is therefore a very important object to achieve.

SUMMARY OF THE INVENTION

The present invention is a technique for solving those problems, and an object of the present invention is to provide a metal wiring suitable for a substrate of large size and a method of manufacturing the metal wiring, and to provide a metal wiring substrate and a method of manufacturing the metal wiring substrate.

A metal wiring of the present invention comprises a conductive layer formed from a tungsten film, or a metal compound film with a tungsten compound as its main ingredient, or a metal alloy film with a tungsten alloy as its main ingredient, and is characterized in that the conductive film is tapered around the edges to have a taper angle α of 5 to 85°.

The above structure is characterized in that the metal alloy film is an alloy film of tungsten and one or more kinds of elements selected from the group consisting of Ta, Ti, Mo, Cr, Nb, Si, Sc, and Nd.

In addition, the above structure is characterized in that the metal compound film is an tungsten nitride film.

Another structure of a metal wiring of the present invention comprises a conductive layer formed from an aluminum film, or a metal compound film with an aluminum compound as its main ingredient, or a metal alloy film with an aluminum alloy as its main ingredient, and is characterized in that the conductive film is tapered around the edges to have a taper angle α of 5 to 85°.

The above structure is characterized in that the metal alloy film is an alloy film of aluminum and one or more kinds of elements selected from the group consisting of Ta, Ti, Mo, Cr, Nb, Si, Sc, and Nd.

In addition, the above structure is characterized in that the metal compound film is an aluminum nitride film.

In the above structures, a conductive silicon film (for example, a silicon film doped with phosphorus or a silicon film doped with boron) may be provided on the lowermost layer in order to improve adhesive properties.

A metal wiring substrate of the present invention comprises an insulating substrate and a metal wiring, and is characterized in that: the metal wiring is a conductive layer formed from a tungsten film, or a metal compound film with a tungsten compound as its main ingredient, or a metal alloy film with a tungsten alloy as its main ingredient; and the conductive layer is tapered around the edges to have a taper angle α of 5 to 85°.

Another structure of a metal wiring substrate of the present invention comprises an insulating substrate and a metal wiring, and is characterized in that: the metal wiring is a conductive layer formed from an aluminum film, or a metal compound film with an aluminum compound as its main ingredient, or a metal alloy film with an aluminum alloy as its main ingredient; and the conductive layer is tapered around the edges to have a taper angle α of 5 to 85°.

A structure of the present invention regarding a method of manufacturing a metal wiring is characterized in that at least one layer of conductive film is formed on an insulating surface, a resist pattern is formed on the conductive film, and the conductive film having the resist pattern is etched to form a metal wiring while controlling its taper angle α in accordance with the bias power density.

Another structure of the present invention regarding a method of manufacturing a metal wiring is characterized in that at least one layer of conductive film is formed on an insulating surface, a resist pattern is formed on the conductive film, and the conductive film having the resist pattern is etched to form a metal wiring while controlling its taper angle α in accordance with the ICP power density.

Still another structure of the present invention regarding a method of manufacturing a metal wiring is characterized in that at least one layer of conductive film is formed on an insulating surface, a resist pattern is formed on the conductive film, and the conductive film having the resist pattern is etched to form a metal wiring while controlling its taper angle α in accordance with the temperature of a lower electrode.

The above structure regarding a method of manufacturing a metal wiring is characterized in that the temperature of the lower electrode is set to 85 to 120° C.

Yet still another structure of the present invention regarding a method of manufacturing a metal wiring is characterized in that at least one layer of conductive film is formed on an insulating surface, a resist pattern is formed on the conductive film, and the conductive film having the resist pattern is etched to form a metal wiring while controlling its taper angle α in accordance with the pressure.

The above structure regarding a method of manufacturing a metal wiring is characterized in that the pressure is set to 2 to 13 Pa.

A further structure of the present invention regarding a method of manufacturing a metal wiring is characterized in that at least one layer of conductive film is formed on an insulating surface, a resist pattern is formed on the conductive film, and the conductive film having the resist pattern is etched to form a metal wiring while controlling its taper angle α in accordance with the flow rate of the reaction gas.

The above structure regarding a method of manufacturing a metal wiring is characterized in that the total flow rate of the reaction gas is set to $2 \times 10^3$ to $11 \times 10^3$ sccm/m$^3$.

A further structure of the present invention regarding a method of manufacturing a metal wiring is characterized in that at least one layer of conductive film is formed on an insulating surface, a resist pattern is formed on the conductive film, and the conductive film having the resist pattern is etched to form a metal wiring while controlling its taper angle α in accordance with the ratio of oxygen in a reaction gas.

The above structure regarding a method of manufacturing a metal wiring is characterized in that the ratio of oxygen in the reaction gas is set to 17 to 50%.

A further structure of the present invention regarding a method of manufacturing a metal wiring is characterized in that at least one layer of conductive film is formed on an insulating surface, a resist pattern is formed on the conductive film, and the conductive film having the resist pattern is etched to form a metal wiring while controlling its taper angle α in accordance with the ratio of chlorine in a reaction gas.

The above structures regarding a method of manufacturing a metal wiring are characterized in that the metal thin film is a thin film selected from the group consisting of a tungsten film, a metal compound film with a tungsten compound as its main ingredient, and a metal alloy film with a tungsten alloy as its main ingredient, or a thin film selected from the group consisting of an aluminum film, a metal compound film with an aluminum compound as its main ingredient, and a metal alloy film with an aluminum alloy as its main ingredient.

A structure of the present invention regarding a method of manufacturing a metal wiring substrate disclosed in this specification comprises a method of manufacturing an insulating substrate and a metal wiring, and is characterized in that at least one layer of conductive film is formed on an insulating surface, a resist pattern is formed on the conductive film, and the conductive film having the resist pattern is etched to form a metal wiring while controlling its taper angle α in accordance with the bias power density.

Another structure of the present invention regarding a method of manufacturing a metal wiring substrate comprises a method of manufacturing an insulating substrate and a metal wiring, and is characterized in that at least one layer of conductive film is formed on an insulating surface, a resist pattern is formed on the conductive film, and the conductive film having the resist pattern is etched to form a metal wiring while controlling its taper angle α in accordance with the ICP power density.

Still another structure of the present invention regarding a method of manufacturing a metal wiring substrate comprises a method of manufacturing an insulating substrate and a metal wiring, and is characterized in that at least one layer of conductive film is formed on an insulating surface, a resist pattern is formed on the conductive film, and the conductive film having the resist pattern is etched to form a metal wiring while controlling its taper angle α in accordance with the temperature of a lower electrode.

The above structure regarding a method of manufacturing a metal wiring substrate is characterized in that the temperature of the lower electrode is set to 85 to 120° C.

Yet still another structure of the present invention regarding a method of manufacturing a metal wiring substrate comprises a method of manufacturing an insulating substrate and a metal wiring, and is characterized in that at least one layer of conductive film is formed on an insulating surface, a resist pattern is formed on the conductive film, and the conductive film having the resist pattern is etched to form a metal wiring while controlling its taper angle α in accordance with the pressure.

The above structure regarding a method of manufacturing a metal wiring substrate is characterized in that the pressure is set to 2 to 13 Pa.

A further structure of the present invention regarding a method of manufacturing a metal wiring substrate comprises a method of manufacturing an insulating substrate and a metal wiring, and is characterized in that at least one layer of conductive film is formed on an insulating surface, a resist pattern is formed on the conductive film, and the conductive film having the resist pattern is etched to form a metal wiring while controlling its taper angle α in accordance with the total flow rate of the reaction gas.

The above structure regarding a method of manufacturing a metal wiring substrate is characterized in that the total flow rate of the reaction gas is set to $2 \times 10^3$ to $11 \times 10^3$ sccm/m$^3$.

A further structure of the present invention regarding a method of manufacturing a metal wiring substrate comprises a method of manufacturing an insulating substrate and a metal wiring, and is characterized in that at least one layer of conductive film is formed on an insulating surface, a resist pattern is formed on the conductive film, and the conductive film having the resist pattern is etched to form a metal wiring while controlling its taper angle α in accordance with the ratio of oxygen in a reaction gas.

The above structure regarding a method of manufacturing a metal wiring substrate is characterized in that the ratio of oxygen in the reaction gas is set to 17 to 50%.

A further structure of the present invention regarding a method of manufacturing a metal wiring substrate comprises a method of manufacturing an insulating substrate and a metal wiring, and is characterized in that at least one layer of conductive film is formed on an insulating surface, a resist pattern is formed on the conductive film, and the conductive film having the resist pattern is etched to form a metal wiring while controlling its taper angle α in accordance with the ratio of chlorine in a reaction gas.

The above structures regarding a method of manufacturing a metal wiring substrate are characterized in that the metal thin film is a thin film selected from the group consisting of a tungsten film, a metal compound film with a tungsten compound as its main ingredient, and a metal alloy film with a tungsten alloy as its main ingredient, or a thin film selected from the group consisting of an aluminum film, a metal compound film with an aluminum compound as its main ingredient, and a metal alloy film with an aluminum alloy as its main ingredient. The term metal wiring substrate refers to an insulating substrate such as a glass substrate, or other kinds of substrates, having a metal wiring formed by a thin film technology.

BRIEF DESCRIPTION OF THE DRAWINGS

In the accompanying drawings:

FIGS. 19A to 19C are sectional views showing a process of manufacturing a pixel TFT and driving circuit TFTs;

FIGS. 20A to 20C are sectional views showing a process of manufacturing a pixel TFT and driving circuit TFTs;

DETAILED DESCRIPTION OF THE PREFERRED EMBODIMENTS

[Embodiment Mode 1]

The present invention employs ICP etching apparatus that uses high-density plasma. The ICP etching apparatus forms plasma through inductive coupling of RF power at a low pressure, thereby obtaining a plasma density of $10^{11}$/cm$^3$ or higher. Using the thus obtained high-density plasma, the apparatus processes at high selective ratio and etching rate.

Figure 7A:
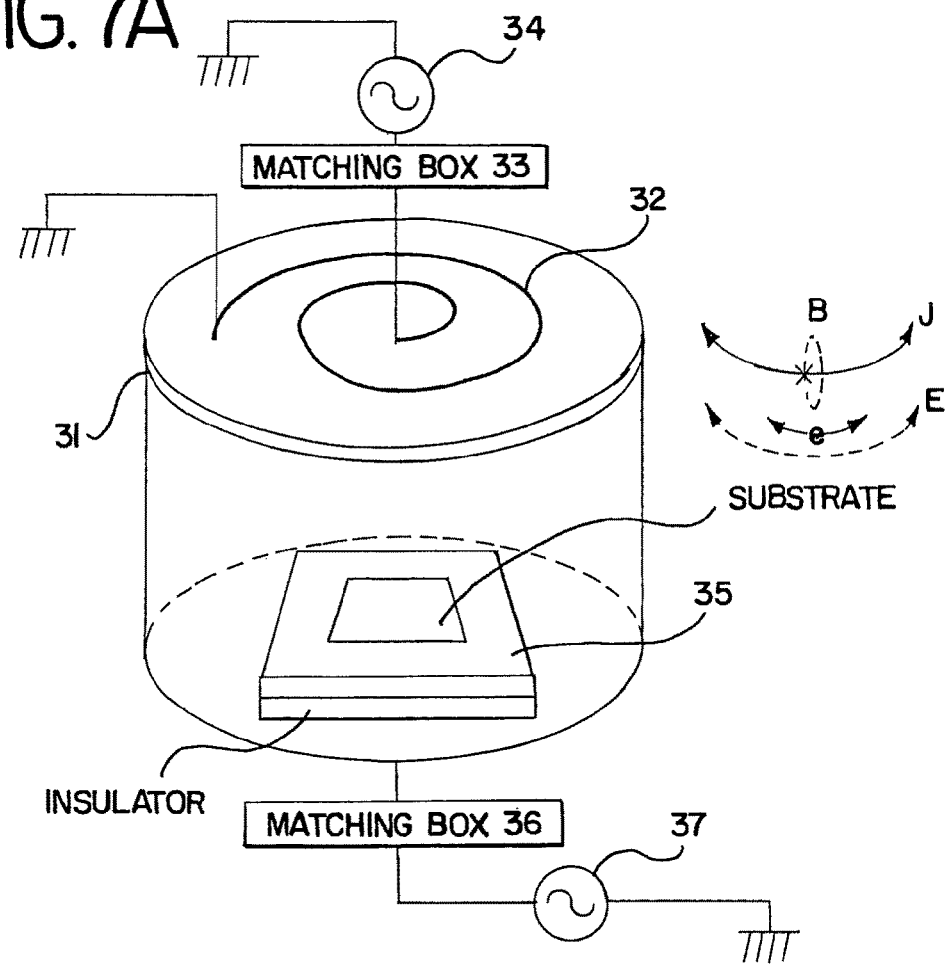
FIGS. 7A and 7B are diagrams showing examples of ICP etching apparatus.

First, a detailed description is given on the plasma generating mechanism of ICP dry etching apparatus with reference to FIG. 7A. FIG. 7A is a simplified structural diagram of an etching chamber. A quartz plate 31 is positioned in an upper part of the chamber and an antenna coil 32 is placed on the quartz plate 31. The antenna coil 32 is connected to an RF power supply 34 through a matching box 33. A lower electrode 35 on the substrate side opposite to the antenna coil is connected to another RF power supply 37 through a matching box 36.

When an RF power is applied to the antenna coil 32 above the substrate, an RF current J flows through the antenna coil 32 in a direction θ and a magnetic field B is generated in a direction Z. The current J and the magnetic field B satisfy the following expression.

$\mu_0 J = \mathrm{rot} B$     [Mathematic Expression 1]

An inductive electric field E is generated in the direction θ in accordance with Faraday's law of electromagnetic induction. The magnetic field B and the inductive electric field E satisfy the following expression.

$-\partial B/\partial t = \mathrm{rot} E$     [Mathematic Expression 2]

In the inductive electric field E, electrons are accelerated in the direction θ and collide with gas molecules to generate plasma. Since the direction of inductive electric field is the direction θ, the probability of charged particles colliding against the etching chamber walls and the substrate and losing electric charges is low. Accordingly, high-density plasma can be generated at as low pressure as about 1 Pa. The downstream has almost no magnetic field B and therefore a high-density plasma region spread like a sheet is obtained.

The plasma density and the self-bias voltage can be controlled individually by adjusting the RF power applied to the antenna coil 32 (to which an ICP power is applied) and the RF power applied to the substrate-side lower electrode 35 (to which a bias power is applied). The frequency of RF power applied can also be varied in accordance with the material of subject to be processed.

Figure 7B:
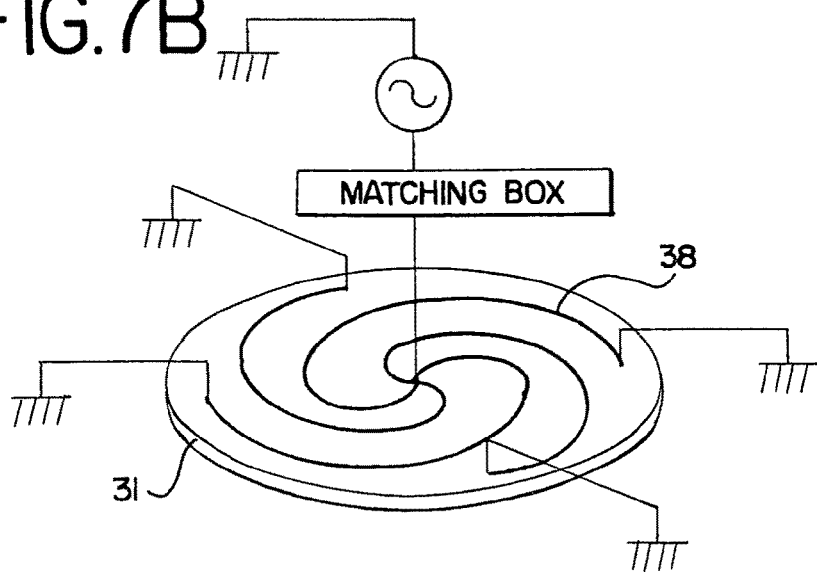

In order to obtain high-density plasma in the ICP etching apparatus, the RF current J has to flow in the antenna coil 32 with small loss and, in order to increase the area, the inductance of the antenna coil 32 has to be lowered. For that reason, ICP etching apparatus having a multi-spiral coil 38 that is obtained by dividing an antenna has been developed. A structural diagram of this ICP etching apparatus is shown in FIG. 7B. FIG. 7B is identical with FIG. 7A except for the quartz plate (FIGS. 7A and 7B share the same chamber structure, lower electrode structure, and other structures), and those identical portions are omitted in FIG. 7B. If ICP etching apparatus having the multi-spiral coil 38 as this is employed, a heat-resistant conductive material can be etched well.

The present inventors have conducted the following experiments using ICP etching apparatus of this multi-spiral coil type (E645, a product of Matsushita Electric Industrial Co., Ltd.) while varying the etching conditions.

First, a sample is prepared by forming a conductive film that is a W film on a glass substrate by sputtering to a thickness of 500 nm. Then resist is formed and the W film is etched under etching conditions which include the bias power density, the ICP power density, the pressure, the ratio of oxygen added in etching, the total flow rate of etching gas, and the temperature of lower electrode and which are varied for each sample. The etching conditions are varied as shown in Table 1. In an evaluation where one etching condition is varied, the other etching conditions are set as shown in Table 2. The bias power and ICP power in Tables 1 and 2 are a value obtained by dividing bias power by an area to which the bias power is applied, 12.5 cm×12.5 cm, and a value obtained by dividing ICP power by an area to which the ICP power is applied, 12.5 cm×12.5 cm×π, respectively. The volume of the chamber is $18.4 \times 10^{-3}$ m$^3$, and the total flow rate of etching gas in the tables is a value obtained by dividing flow rate by the volume of the chamber.

TABLE 1

| | |
|---|---|
| Bias power density [W/cm$^2$] | 0.128, 0.256, 0.512, 0.96, 1.6 |
| ICP power density [W/cm$^2$] | 0.14, 0.42, 0.71, 0.99 |
| Pressure [Pa] | 1.0, 1.5, 2.0, 5.0 |
| Oxygen addition ratio [%] (CF$_4$:Cl$_2$:O$_2$ [sccm/m$^3$]) | 10 (1.47 × 10$^3$:1.47 × 10$^3$:0.33 × 10$^3$) |
| | 17 (1.36 × 10$^3$:1.36 × 10$^3$:0.54 × 10$^3$) |
| | 23 (1.25 × 10$^3$:1.25 × 10$^3$:0.76 × 10$^3$) |
| | 33 (1.09 × 10$^3$:1.09 × 10$^3$:0.54 × 10$^3$) |
| Total gas flow rate [sccm/m$^3$] | 1.30 × 10$^3$ (0.54 × 10$^3$:0.54 × 10$^3$:0.22 × 10$^3$) |
| (CF$_4$:Cl$_2$:O$_2$ [sccm/m$^3$]) | 1.96 × 10$^3$ (0.82 × 10$^3$:0.82 × 10$^3$:0.33 × 10$^3$) |
| | 2.61 × 10$^3$ (1.09 × 10$^3$:1.09 × 10$^3$:0.43 × 10$^3$) |
| | 3.26 × 10$^3$ (1.36 × 10$^3$:1.36 × 10$^3$:0.54 × 10$^3$) |
| Temperature of lower electrode [° C.] | 40, 55, 70, 85 |

TABLE 2

| | |
|---|---|
| Bias power density [W/cm$^2$] | 0.96 |
| ICP power density [W/cm$^2$] | 0.71 |
| Pressure [Pa] | 1.0 |
| Oxygen addition ratio [%] | 17% |

TABLE 2-continued

| | |
|---|---|
| Total gas flow rate [sccm/m³] (CF$_4$:Cl$_2$:O$_2$ [sccm/m³]) | 3.26 × 10³ sccm/m³ (1.36 × 10³:1.36 × 10³:0.54 × 10³) |
| Temperature of lower electrode [° C.] | 70 |

Figure 1A:
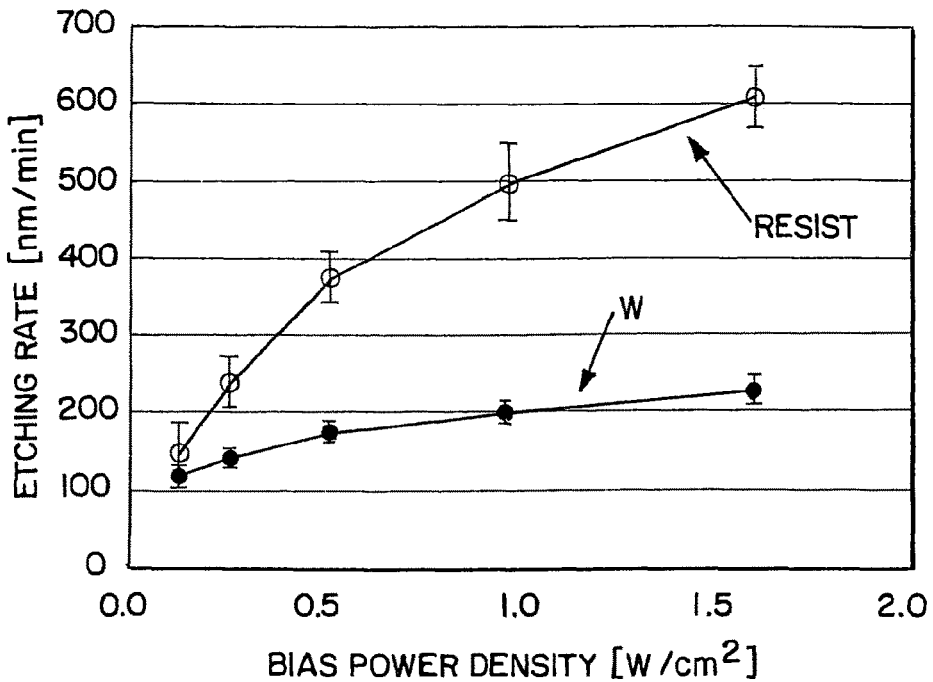
FIG. 1A is a diagram showing the relation of etching rates of W and resist to the bias power density.
Figure 1B:
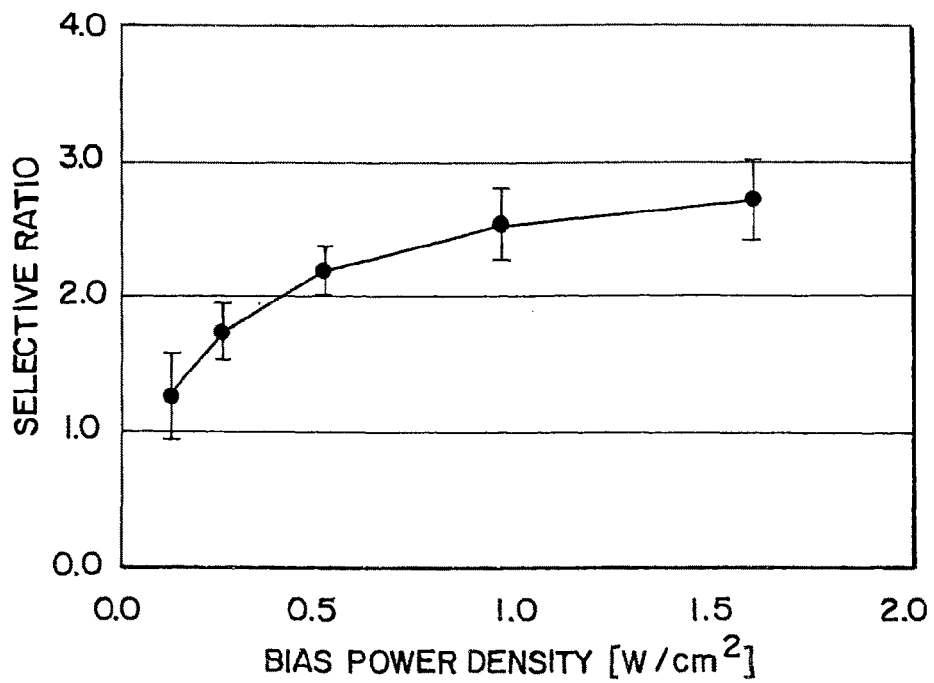
FIG. 1B is a diagram showing the relation of selective ratios of W and resist to the bias power density.
Figure 6A:
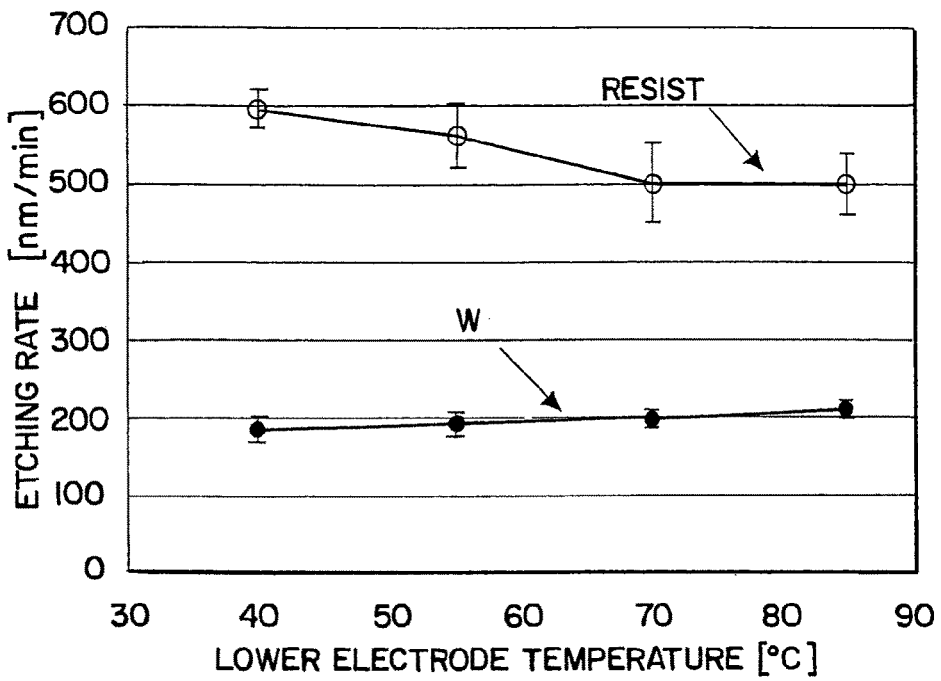
FIG. 6A is a diagram showing the relation of etching rates of W and resist to the temperature of lower electrode.
Figure 6B:
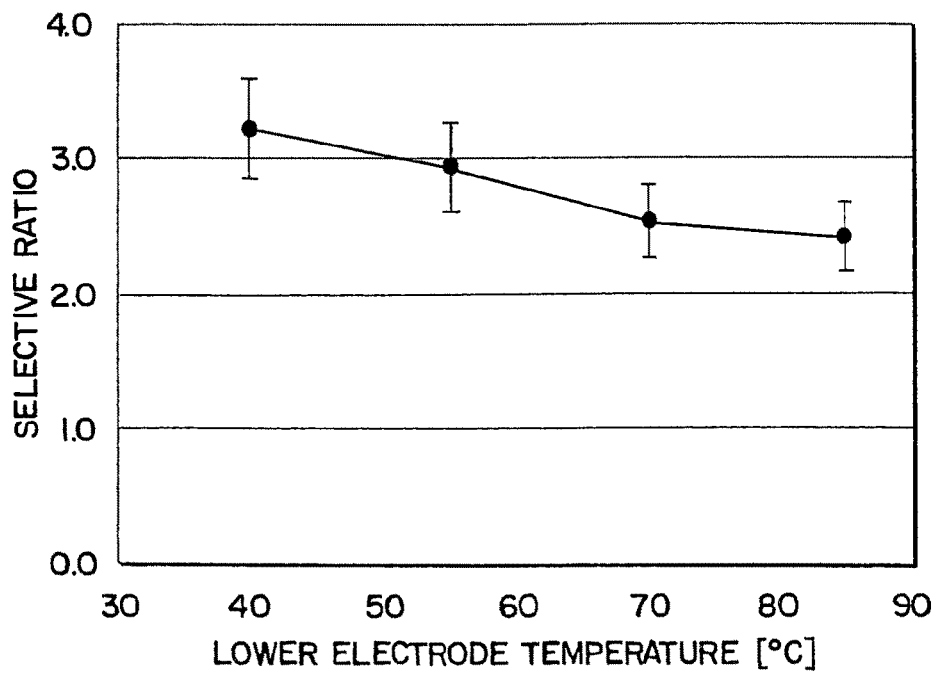
FIG. 6B is a diagram showing the relation of selective ratios of W and resist to the temperature of lower electrode.

FIGS. 1A to 6B show results obtained by varying the etching conditions. FIGS. 1A, 2A, 3A, 4A, 5A, and 6A are for results about etching rates of W and resist. FIGS. 1B, 2B, 3B, 4B, 5B, and 6B are for results about the selective ratio of W to resist. In each graph, there are sixteen measurement points on a substrate surface and fluctuation throughout the substrate surface is indicated by error bars. FIGS. 1A and 1B show results of when the bias power density condition is varied. FIGS. 2A and 2B show results of when the ICP power density condition is varied. FIGS. 3A and 3B show results of when the pressure condition is varied. FIGS. 4A and 4B show results of when the oxygen ratio condition is varied. FIGS. 5A and 5B show results of when the gas total flow rate condition is varied. FIGS. 6A and 6B show results of when the lower electrode temperature condition is varied.

Figure 2A:
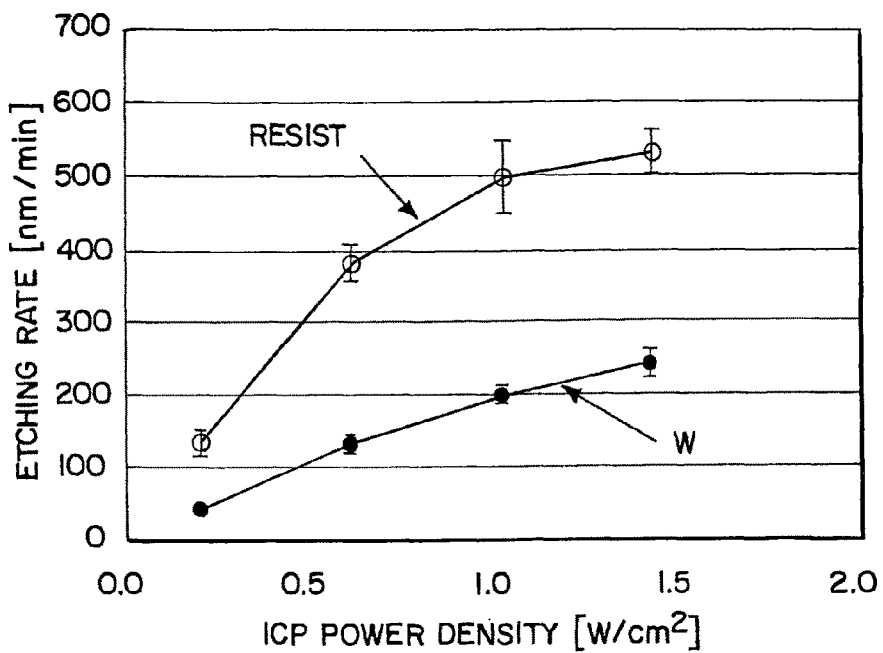
FIG. 2A is a diagram showing the relation of etching rates of W and resist to the ICP power density.
Figure 2B:
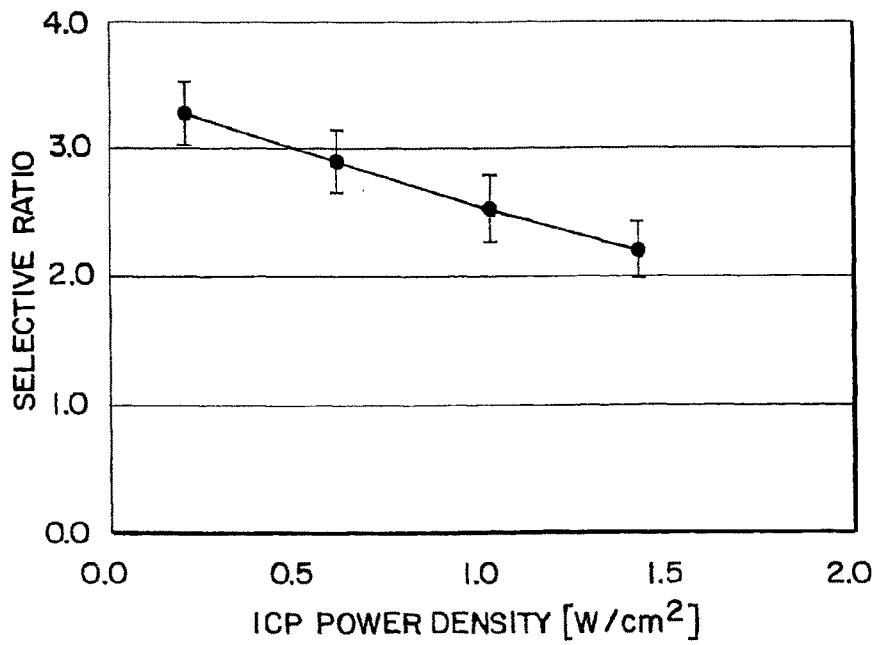
FIG. 2B is a diagram showing the relation of selective ratios of W and resist to the ICP power density.
Figure 3A:
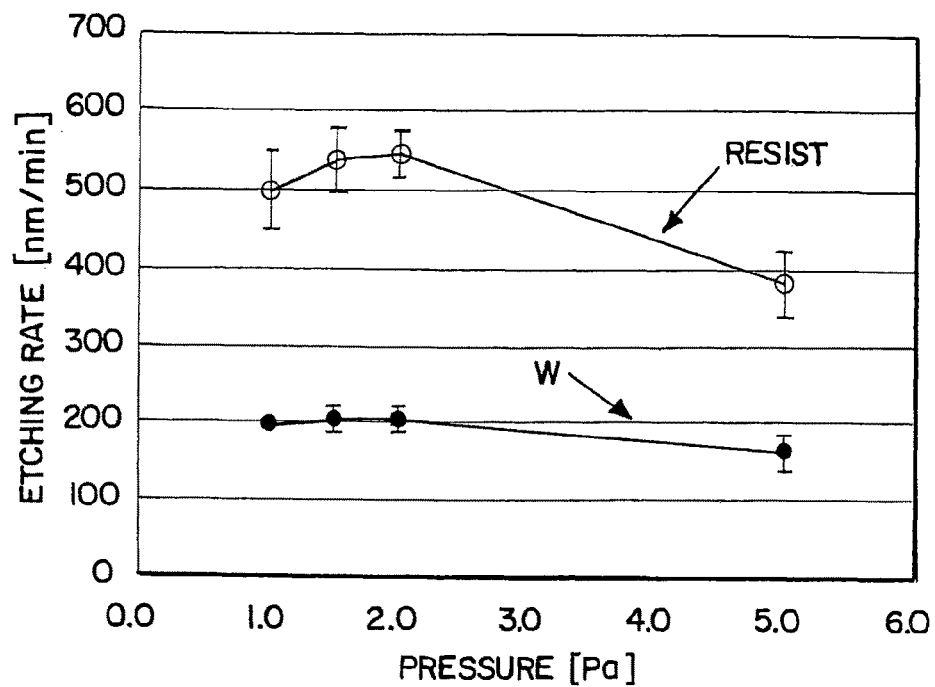
FIG. 3A is a diagram showing the relation of etching rates of W and resist to the pressure.
Figure 3B:
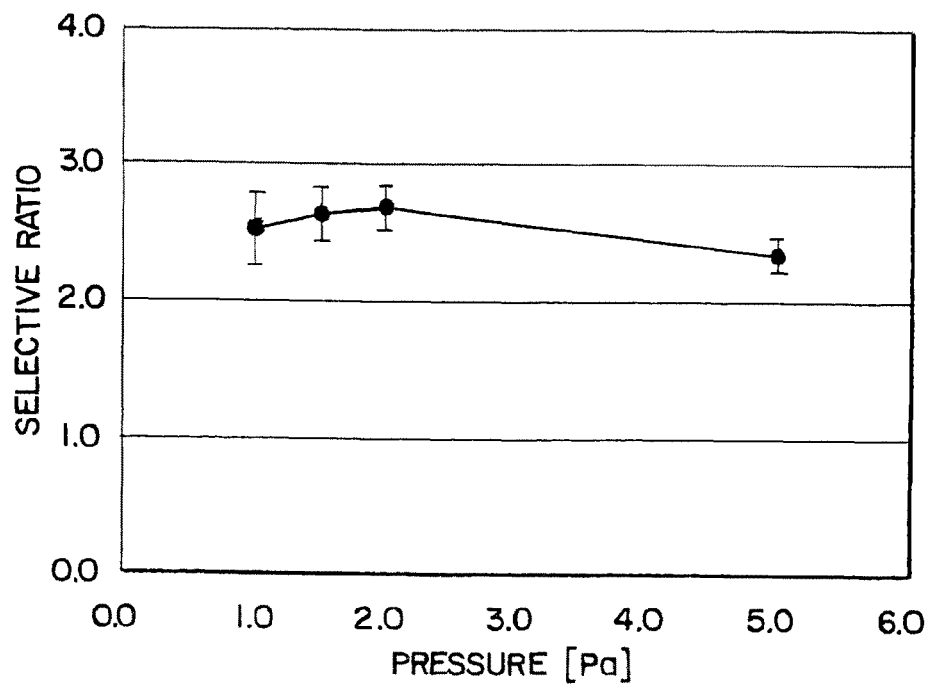
FIG. 3B is a diagram showing the relation of selective ratios of W and resist to the pressure.
Figure 4A:
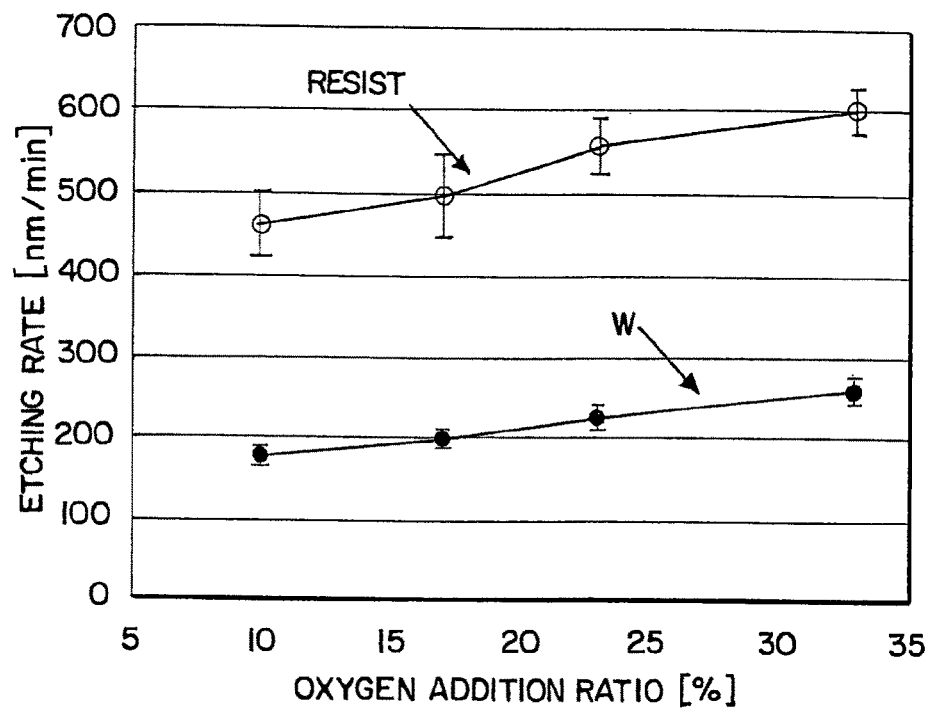
FIG. 4A is a diagram showing the relation of etching rates of W and resist to the ratio of oxygen added to etching gas.
Figure 4B:
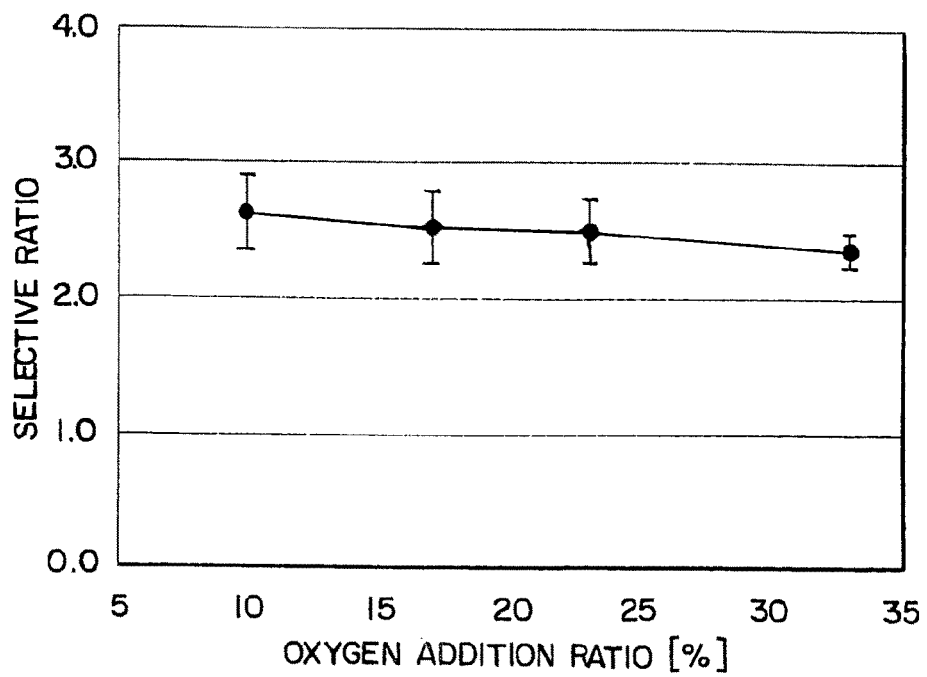
FIG. 4B is a diagram showing the relation of selective ratios of W and resist to the ratio of oxygen added to etching gas.
Figure 5A:
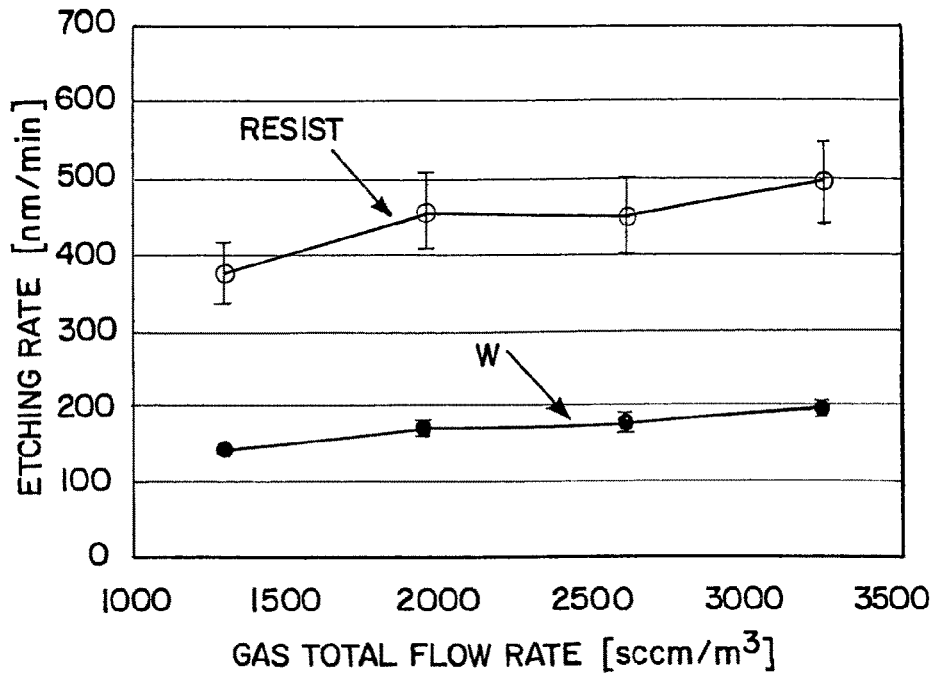
FIG. 5A is a diagram showing the relation of etching rates of W and resist to the total flow rate of etching gas.
Figure 5B:
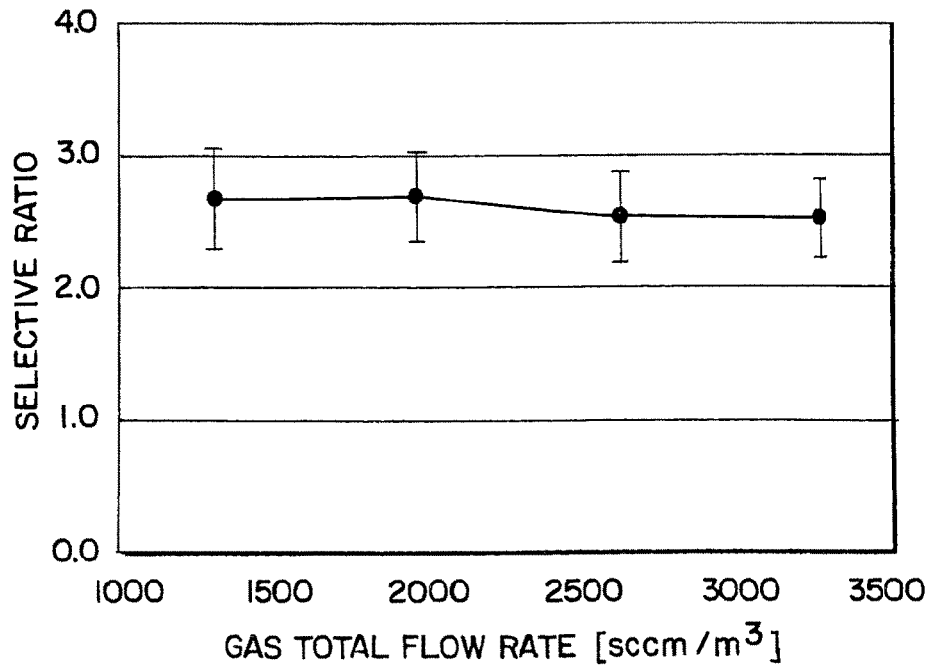
FIG. 5B is a diagram showing the relation of selective ratios of W and resist to the total flow rate of etching gas.

Fluctuation throughout a substrate surface is considered first. FIG. 1A shows that the fluctuation is minimum when the bias power density is 0.256 to 0.512 W/cm² and that the fluctuation rises when the bias power density is 0.96 W/cm² or higher. FIG. 2A shows that the fluctuation exhibits no particular tendency caused by varying the ICP power density condition. FIGS. 3A, 4A, 5A, and 6A show that the fluctuation is small when the pressure, the oxygen addition ratio, the gas total flow rate, and the lower electrode temperature are high.

The selective ratio of W to resist is considered next. FIGS. 1B, 2B, 3B, 4B, 5B, and 6B show that the selective ratio of W to resist is changed greatly as the bias power density condition, the ICP power density condition, and the lower electrode temperature condition are varied. In other words, the etching conditions that influence the selective ratio of W to resist are the bias power density, the ICP power density, and the lower electrode temperature.

From the above experiments, it is found that the bias power density, the ICP power density, and the lower electrode temperature hold great influence over the selective ratio of W film to resist. It is also found that the fluctuation throughout the substrate surface can be lowered when the pressure, the oxygen addition ratio, the gas total flow rate, and the lower electrode temperature are set high.

The following experiment has been conducted to examine the correlation between the resist/W ratio and the taper angle. The experiment is described with reference to FIGS. 8A to 8C. The term taper angle refers to an angle α formed between a tapered portion (slanted portion) of a conductive layer 15b in section and a surface of a primary film 17b as shown in FIG. 8C. The taper angle can be expressed by tan α=X/Z wherein Z is the width of the tapered portion and X is the thickness of the film.

First, a silicon oxynitride film (composition ratio: Si=32%, O=27%, N=24%, H=17% or composition ratio: Si=32%, O=59%, N=7%, H=2%) with a thickness of 50 nm is formed as an insulating film 11 on a glass substrate 10 by plasma CVD. On the insulating film 11, a TaN film with a thickness of 50 nm is formed as a first conductive film 12 by sputtering. A W film with a thickness of 370 nm is formed as a second conductive film 13 on the first conductive film 12 by sputtering. Then resist (resist 14a) is formed and the W film (the second conductive film 13) is etched while varying the etching conditions including the bias power density, the ICP power density, the pressure, the ratio of oxygen added in the etching, the total flow rate of etching gas, and the temperature of lower electrode. The etching conditions are varied as shown in Table 1. In an evaluation where one etching condition is varied, the other etching conditions are set as shown in Table 2. In this way a conductive layer 15a is formed. Subsequently, the TaN film (the first conductive film 12) is etched under etching conditions where using CF$_4$ and Cl$_2$ as etching gas, setting the gas flow rate ratio thereof to 30:30 (sccm), and applying an RF (13.56 MHZ) power of 0.71 W/cm² to a coiled electrode at a pressure of 1 Pa for plasma generation. The substrate side (sample stage) also receives an RF (13.56 MHZ) power of 0.128 W/cm² so that substantially negative self-bias voltage is applied. Thus formed are conductive layers 15b and 16b.

Figure 9A:
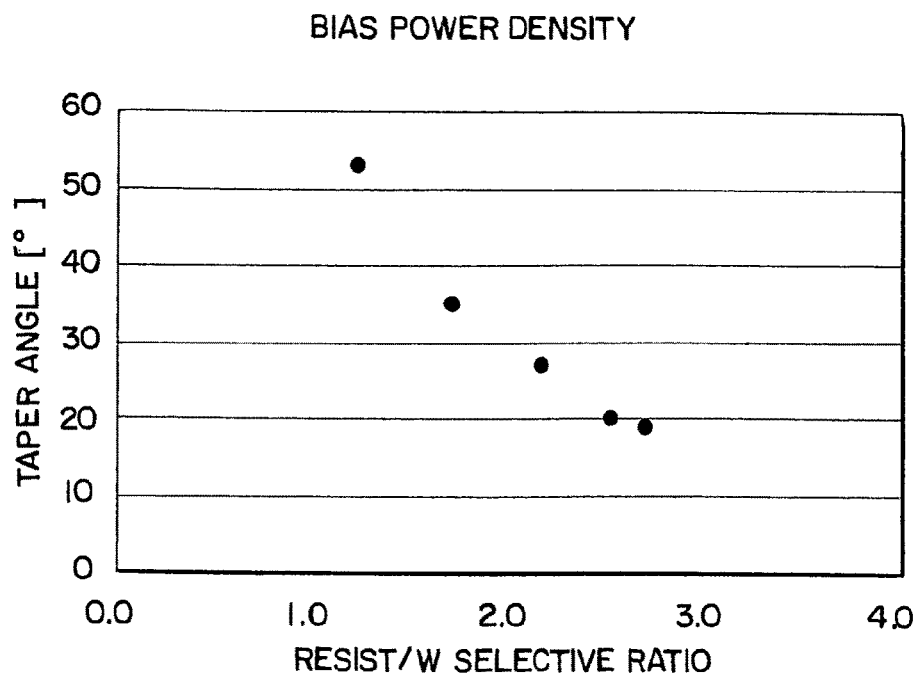
FIG. 9A is a diagram showing the relation of taper angle to the resist/W selective ratio when the bias power density is the parameter.
Figure 9B:
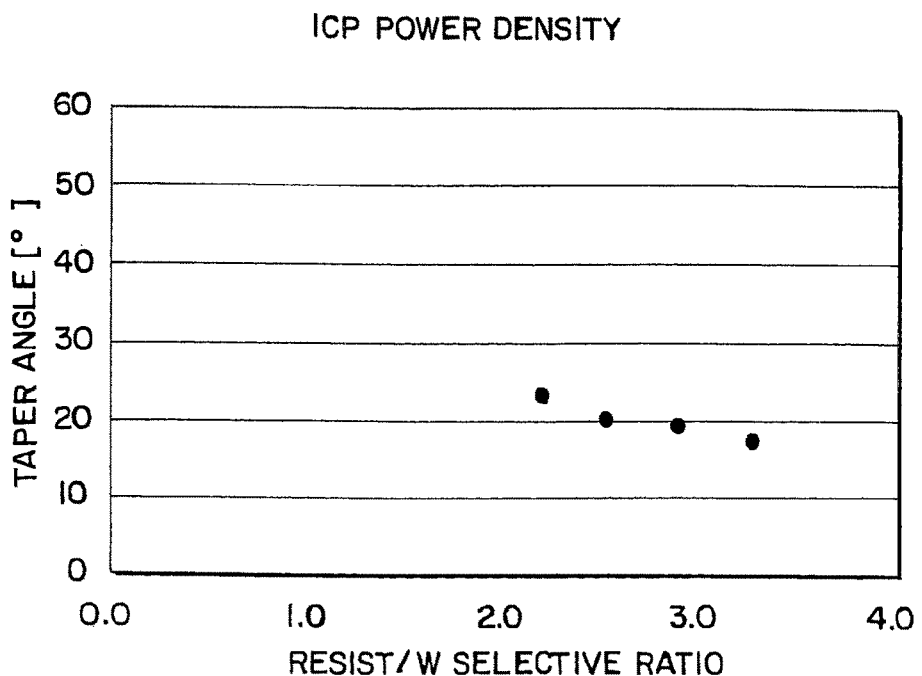
FIG. 9B is a diagram showing the relation of taper angle to the resist/W selective ratio when the ICP power density is the parameter.
Figure 10A:
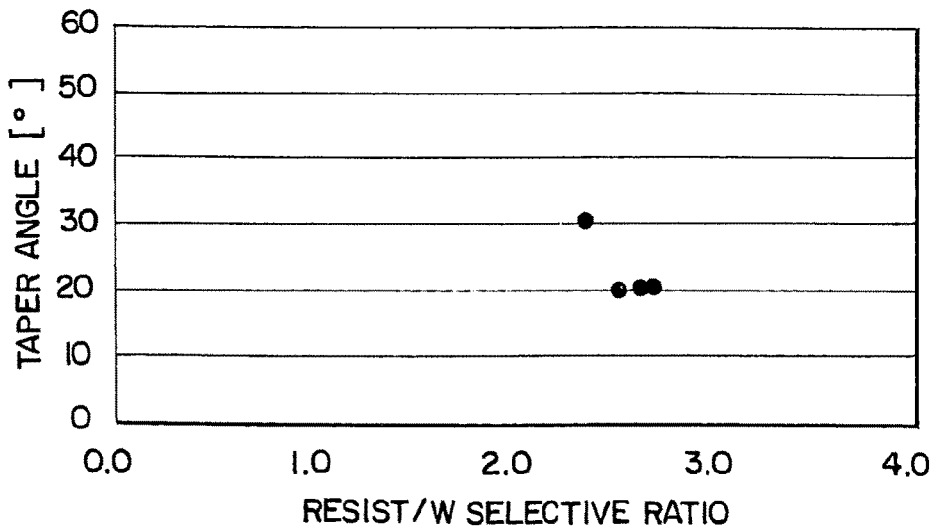
FIG. 10A is a diagram showing the relation of taper angle to the resist/W selective ratio when the pressure is the parameter.
Figure 10B:
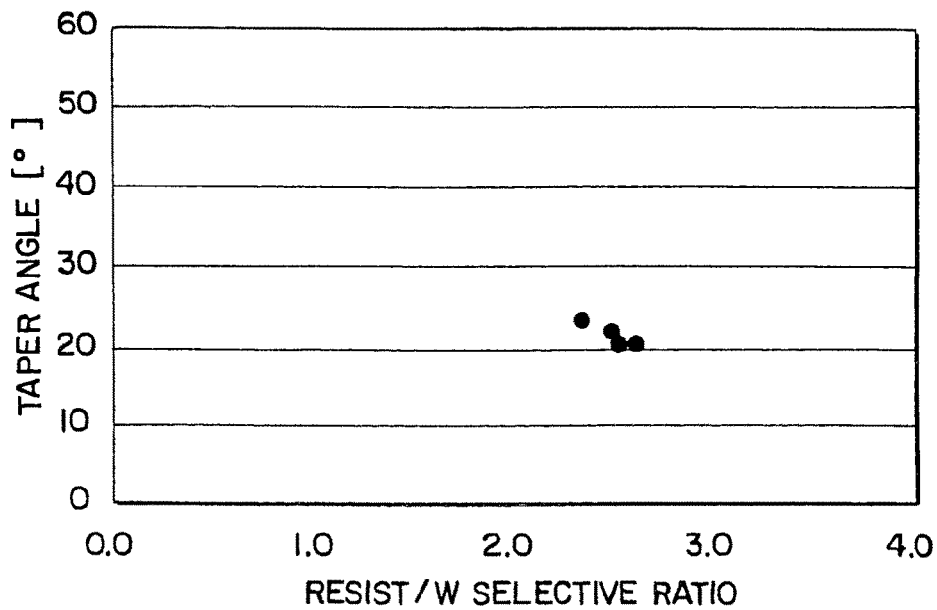
FIG. 10B is a diagram showing the relation of taper angle to the resist/W selective ratio when the ratio of oxygen added to etching gas is the parameter.
Figure 11A:
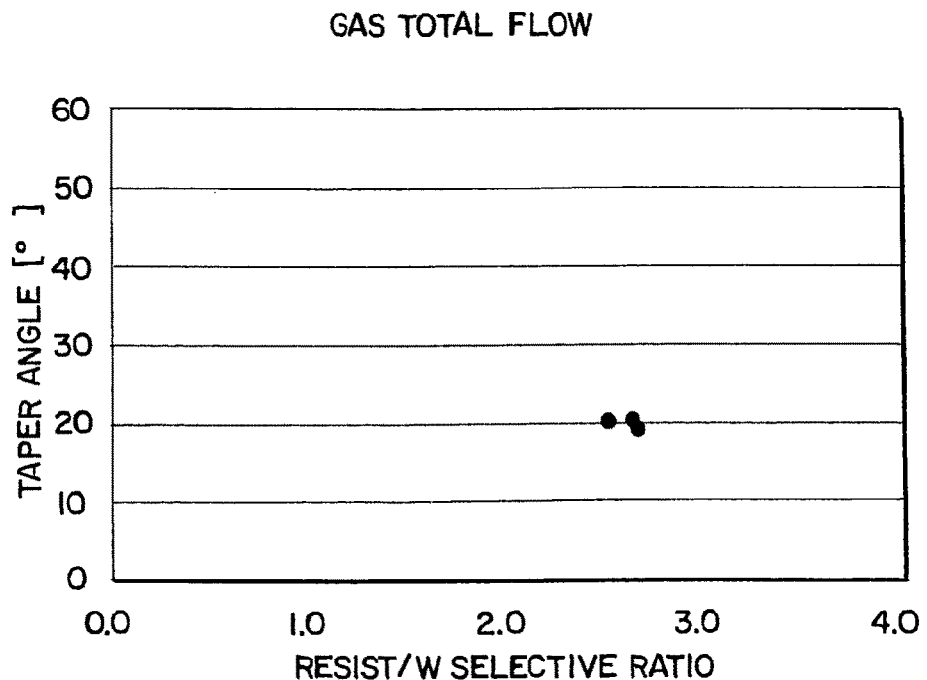
FIG. 11A is a diagram showing the relation of taper angle to the resist/W selective ratio when the total flow rate of etching gas is the parameter.
Figure 11B:
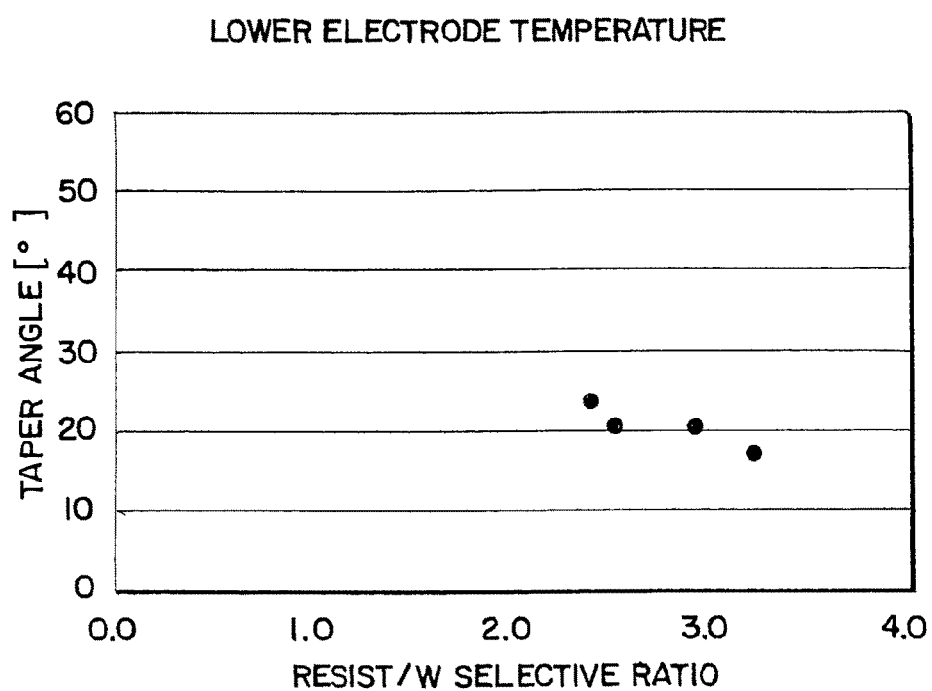
FIG. 11B is a diagram showing the relation of taper angle to the resist/W selective ratio when the temperature of lower electrode is the parameter.

After etching the first conductive film and the second conductive film in this way, the shapes thereof in section are observed by a scanning electron microscope (SEM) at a magnification ×50000 to obtain the taper angle and examine the relation between the taper angle and the resist/W selective ratio. The results are shown in FIGS. 9A to 11B. FIG. 9A shows the relation between the resist/W selective ratio and the taper angle when the bias power density is varied. FIG. 9B shows the relation between the resist/W selective ratio and the taper angle when the ICP power density is varied. FIG. 10A shows the relation between the resist/W selective ratio and the taper angle when the pressure is varied. FIG. 10B shows the relation between the resist/W selective ratio and the taper angle when the ratio of oxygen added to etching gas is varied. FIG. 11A shows the relation between the resist/W selective ratio and the taper angle when the total flow rate of etching gas is varied. FIG. 11B shows the relation between the resist/W selective ratio and the taper angle when the temperature of lower electrode is varied. From FIGS. 9A to 11B, it is understood that the etching conditions that hold great influence over the taper angle are the bias power density, the ICP power density, and the lower electrode temperature.

Therefore, the present invention makes it possible to form a wiring having a desired taper angle and to conduct a highly uniform etching on a large-area substrate by controlling the bias power density, the ICP power density, and the lower electrode temperature during etching of the W film in ICP etching apparatus. Furthermore, the present invention lowers the fluctuation in shape of wiring throughout the substrate surface by setting high the pressure, the oxygen addition ratio, the gas total flow rate, and the lower electrode temperature. A gate electrode formed of a W film that is obtained in accordance with the present invention is less fluctuated in shape throughout a substrate surface. If this gate electrode is used as a mask to introduce an impurity element, fluctuation in width or length of impurity region can be reduced. This means that fluctuation in width or length of channel formation region can be reduced and that TFTs manufactured from this semiconductor film are less fluctuated in their electric characteristics. Furthermore, this can improve the operation characteristics and reliability of the semiconductor device.

The present invention is applicable not only to a W film but also to various films that mainly contain W, such as a Mo—W film, a WSi film, and a TiW film.

[Embodiment Mode 2]

This embodiment gives a description on an experiment in which ICP etching apparatus of multi-spiral coil type described in Embodiment Mode 1 is used to etch a conductive film different from the one in Embodiment Mode 1 while varying etching conditions.

First, a sample is prepared by forming a conductive film that is an Al—Si (2 wt %) film on a glass substrate by sputtering to a thickness of 500 nm. Then resist is formed and the Al—Si film is etched under etching conditions which include the bias power density, the ICP power density, and the ratio of $Cl_2$ added in the etching and which are varied for each sample. The etching conditions are varied as shown in Table 3. In an evaluation where one etching condition is varied, the other etching conditions are set as shown in Table 4. The bias power and ICP power in Tables 3 and 4 are a value obtained by dividing bias power by an area to which the bias power is applied, 12.5 cm×12.5 cm, and a value obtained by dividing ICP power by an area to which the ICP power is applied, 12.5 cm×12.5 cm×π, respectively. The volume of the chamber is $18.4×10^{-3}$ m$^3$, and the total flow rate of etching gas in the tables is a value obtained by dividing flow rate by the volume of the chamber.

TABLE 3

| | |
|---|---|
| Bias power density [W/cm$^2$] | 0.64, 1.28, 1.92, 2.56 |
| ICP power density [W/cm$^2$] | 0.20, 0.61, 1.02, 1.43 |
| $Cl_2$ addition ratio [%] | 12.5 (3.80 × 10$^3$:0.54 × 10$^3$) |
| ($BCl_3$:$Cl_2$ {sccm/m$^3$]) | 15 (3.26 × 10$^3$:1.09 × 10$^3$) |
| | 50 (2.17 × 10$^3$:2.17 × 10$^3$) |
| | 75 (1.09 × 10$^3$:3.26 × 10$^3$) |

TABLE 4

| | |
|---|---|
| Bias power density [W/cm$^2$] | 1.92 |
| ICP power density [W/cm$^2$] | 1.02 |
| Pressure [Pa] | 1.2 |
| $Cl_2$ addition ratio [%] | 15% |
| Total gas flow rate [sccm/m$^3$] | 4.35 × 10$^3$ sccm/m$^3$ |
| ($BCl_3$:$Cl_2$ [sccm/m$^3$]) | (3.26 × 10$^3$:1.09 × 10$^3$) |
| Temperature of lower electrode [° C.] | 70 |

Figure 12A:
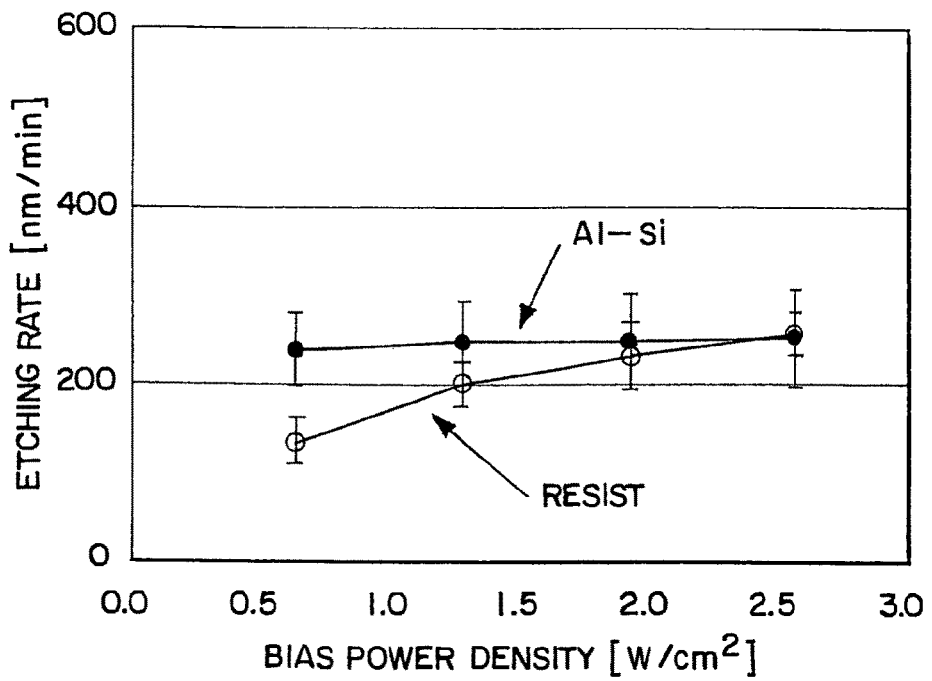
FIG. 12A is a diagram showing the relation of etching rates of Al—Si and resist to the bias power density.
Figure 12B:
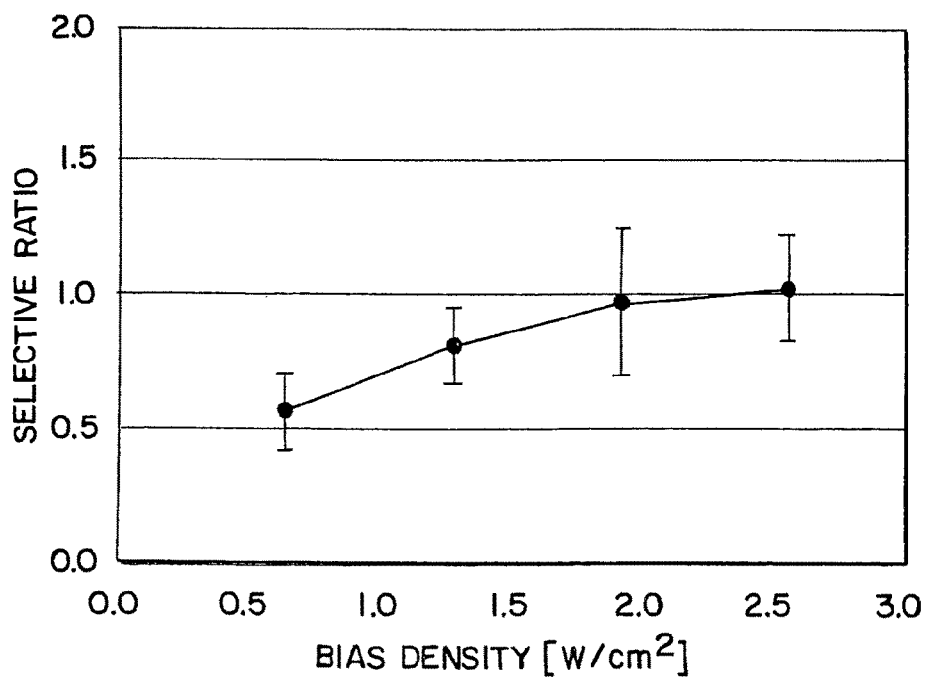
FIG. 12B is a diagram showing the relation of selective ratios of Al—Si and resist to the bias power density.
Figure 13A:
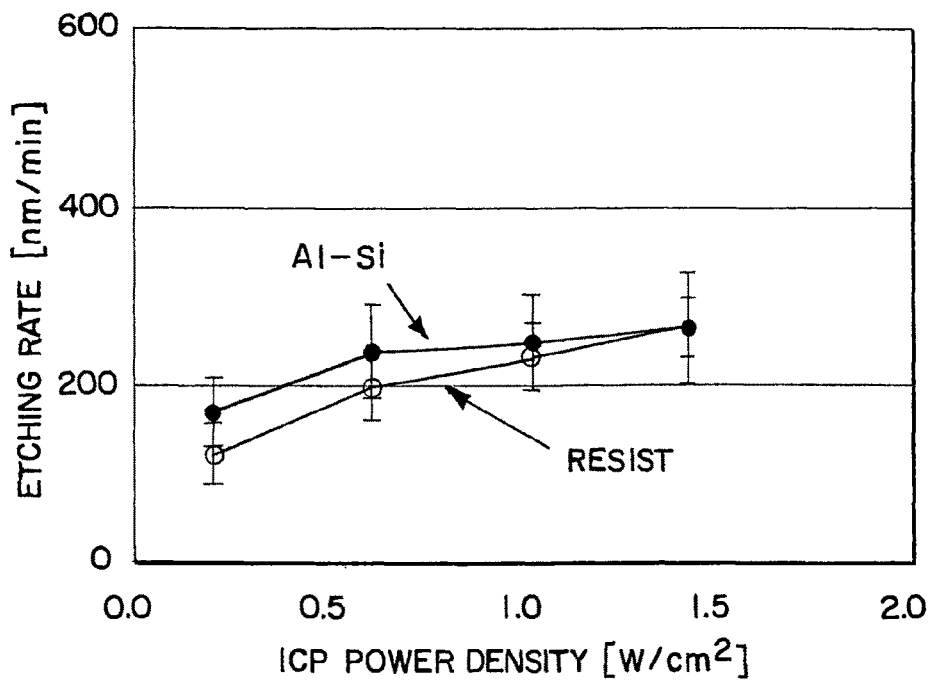
FIG. 13A is a diagram showing the relation of etching rates of Al—Si and resist to the ICP power density.
Figure 13B:
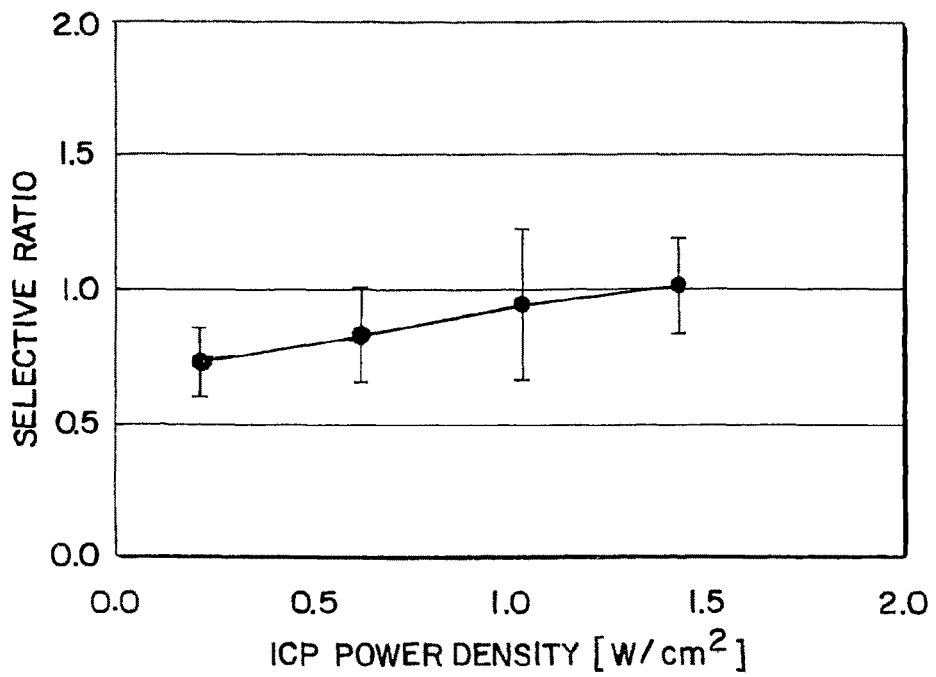
FIG. 13B is a diagram showing the relation of selective ratios of Al—Si and resist to the ICP power density.
Figure 14A:
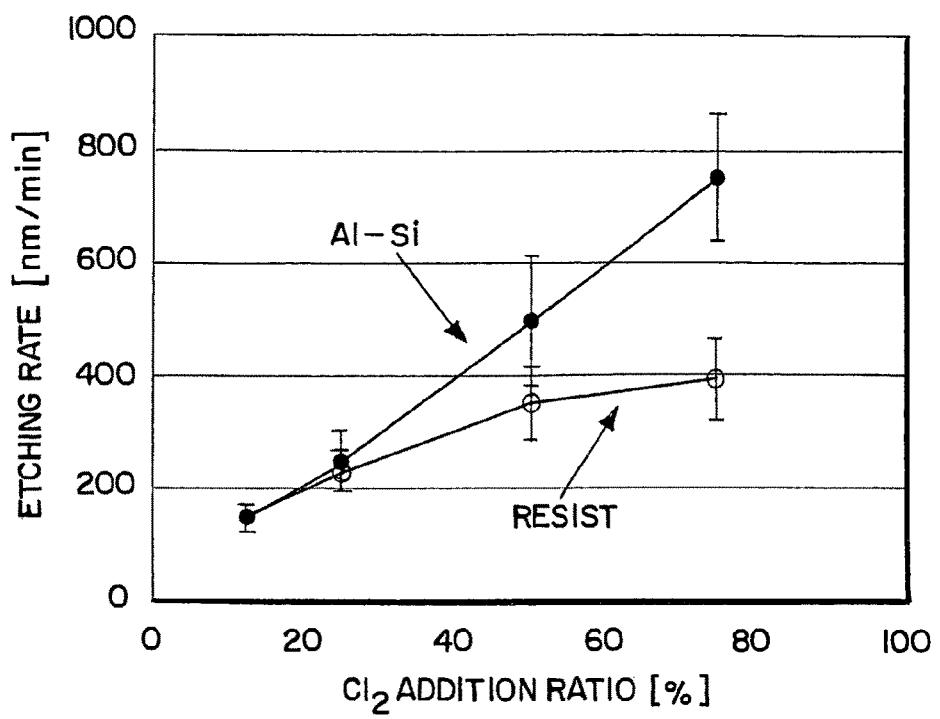
FIG. 14A is a diagram showing the relation of etching rates of Al—Si and resist to the ratio of chlorine added to etching gas.
Figure 14B:
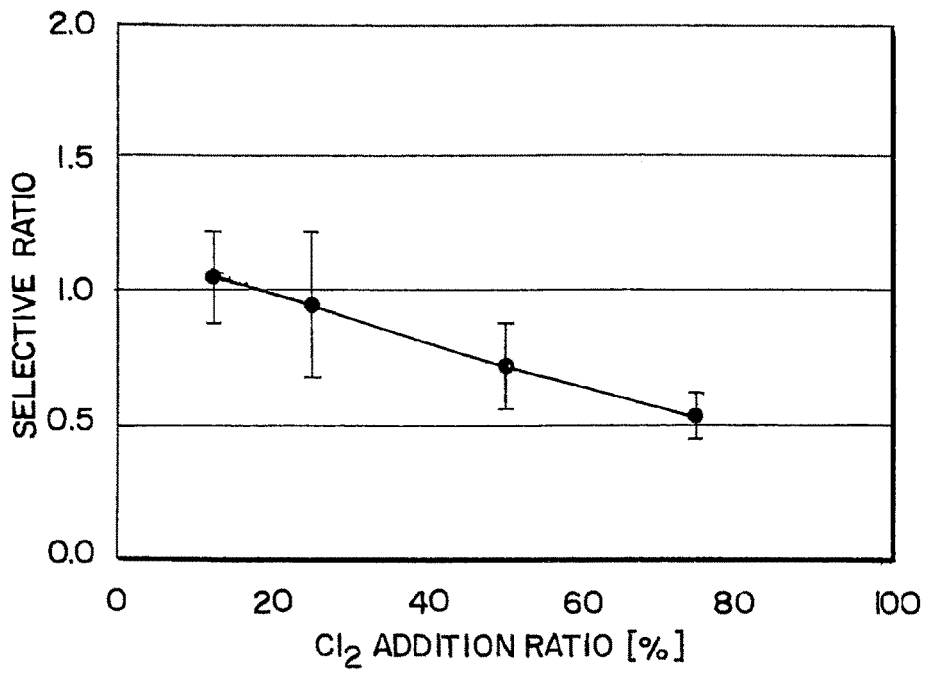
FIG. 14B is a diagram showing the relation of selective ratios of Al—Si and resist to the ratio of chlorine added to etching gas.

FIGS. 12A to 14B show results obtained by varying the etching conditions. FIGS. 12A, 13A, and 14A are for results about etching rates of Al—Si and resist. FIGS. 12B, 13B, and 14B are for results about the selective ratio of Al—Si to resist. In each graph, there are sixteen measurement points on a substrate surface and fluctuation throughout the substrate surface is indicated by error bars. FIGS. 12A and 12B show results of when the bias power density condition is varied. FIGS. 13A and 13B show results of when the ICP power density condition is varied. FIGS. 14A and 14B show results of when the $Cl_2$ addition ratio condition is varied.

The selective ratio of Al—Si to resist is considered. FIGS. 12B, 13B, and 14B show that the selective ratio of Al—Si to resist is changed greatly as the bias power density condition, the ICP power density condition, and the $Cl_2$ addition ratio condition are varied. In other words, the etching conditions that influence the selective ratio of Al—Si to resist are the bias power density, the ICP power density, and the $Cl_2$ addition ratio.

The present invention makes it possible to form a wiring having a desired taper angle by controlling the bias power density, the ICP power density, and the $Cl_2$ addition ratio during etching of the Al—Si film in ICP etching apparatus. A gate electrode formed of an Al—Si film that is obtained in accordance with the present invention can have a desired taper angle. If this gate electrode is used as a mask to introduce an impurity element, an impurity region having a desired width and length can be formed. This makes it possible to form a channel formation region of a desired width and length and TFTs manufactured from this semiconductor film are less fluctuated in their electric characteristics. Furthermore, this can improve the operation characteristics and reliability of the semiconductor device.

The present invention is applicable not only to an Al—Si film but also to various films that mainly contain Al, such as a Al—Ti film, an Al—Sc film, and an Al—Nd film.

Embodiments of the present invention will be described below. The present invention is not limited to the following embodiments as long as the spirit of the present invention is not altered.

[Embodiment 1]

Figure 8A:
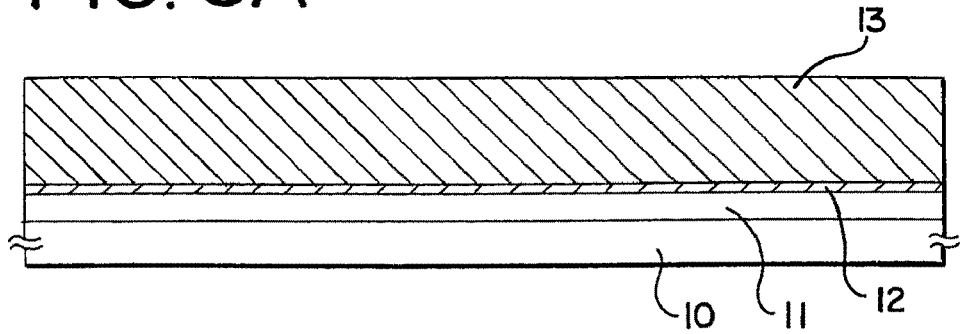
FIGS. 8A to 8C are diagrams showing an example of the concept of the present invention.
Figure 8B:
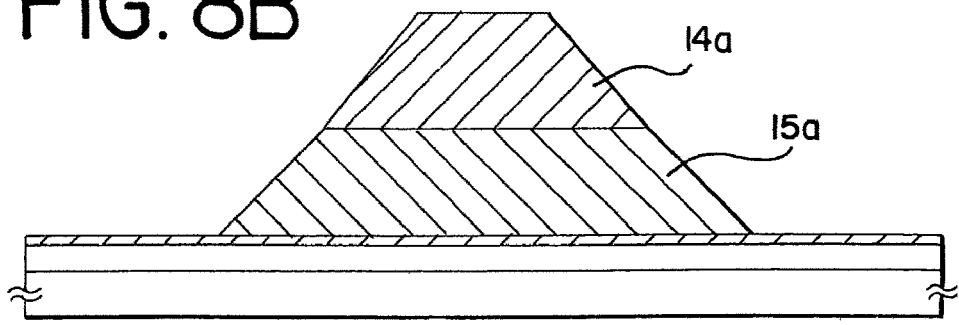
Figure 8C:
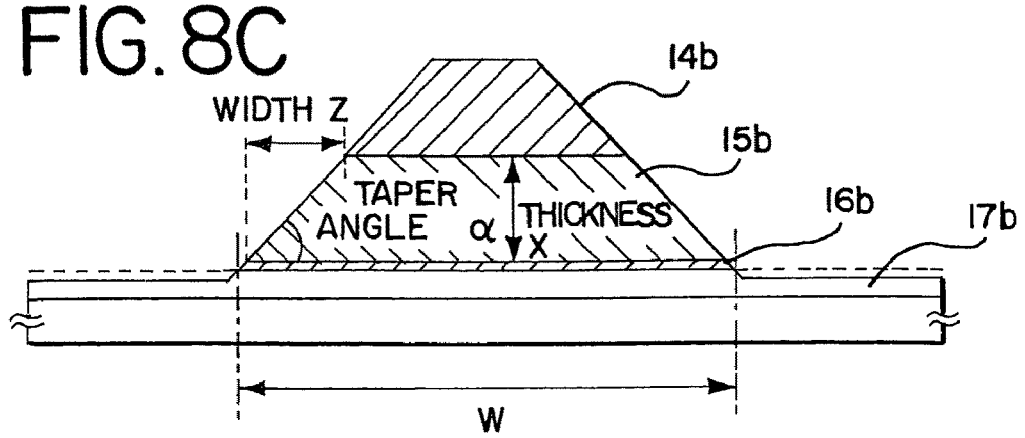

This embodiment describes with reference to FIGS. 8A to 8C an example of forming a metal wiring that has a tapered portion by controlling parameters involved in etching.

First, a silicon oxynitride film (composition ratio: Si=32%, O=27%, N=24%, H=17% or composition ratio: Si=32%, O=59%, N=7%, H=2%) with a thickness of 50 nm is formed as an insulating film 11 on a glass substrate 10 by plasma CVD. On the insulating film 11, a TaN film with a thickness of 50 nm is formed as a first conductive film 12 by sputtering. A W film with a thickness of 370 nm is formed as a second conductive film 13 on the first conductive film 12 by sputtering. Then resist (resist 14*a*) is formed and the W film (the second conductive film 13) is etched while varying the etching conditions including the bias power density, the ICP power density, the pressure, the ratio of oxygen added in the etching, the total flow rate of etching gas, and the temperature of lower electrode. The etching conditions are varied as shown in Table 1. In an evaluation where one etching condition is varied, the other etching conditions are set as shown in Table 2. In this way a conductive layer 15*a* is formed. Subsequently, the TaN film (the first conductive film 12) is etched under etching conditions where using $CF_4$ and $Cl_2$ as etching gas, setting the gas flow rate ratio thereof to 30:30 (sccm), and applying an RF (13.56 MHZ) power of 0.71 W/cm$^2$ to a coiled electrode at a pressure of 1 Pa for plasma generation. The substrate side (sample stage) also receives an RF (13.56 MHZ) power of 0.128 W/cm$^2$ so that substantially negative self-bias voltage is applied. Thus formed are conductive layers 15*b* and 16*b*.

Figure 15:
FIG. 15 is a picture showing an example of the shape of wiring manufactured in accordance with the present invention.

After etching the first conductive film and the second conductive film in this way, the shapes thereof in section are enlarged and observed by an SEM at a magnification ×50000. The results are shown in FIG. 15. The taper angle obtained in this case is 20°.

[Embodiment 2]

In this embodiment, a case where the present invention is applied to an insulated gate field effect transistor (MOSFET or IGFET) to constitute a CMOS circuit will be described with reference to FIGS. 16A to 18.

First, a single crystal silicon substrate 401 is prepared, and an impurity element is implanted to form a p-type well 402 and an n-type well 403. The single crystal silicon substrate may be a p-type or n-type. This structure is a so-called twin tub structure, and is formed with a well concentration of 1×10$^{18}$/cm$^3$ or less. (typically 1×10$^{16}$ to 5×10$^{17}$/cm$^3$)

Figure 16A:
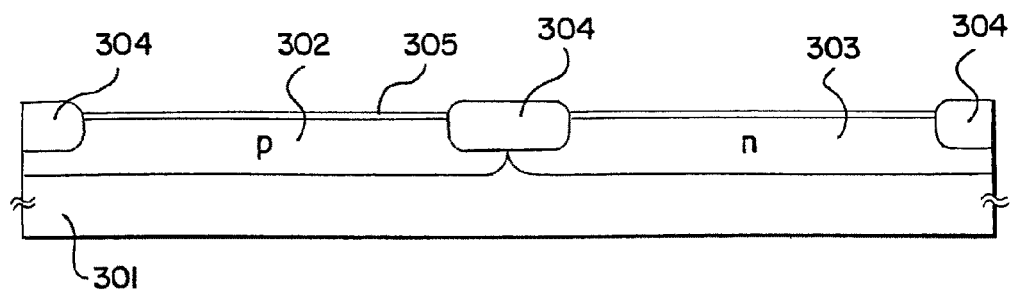
FIGS. 16A to 16C are diagrams showing an example of wiring manufactured in accordance with the present invention.
Figure 16B:
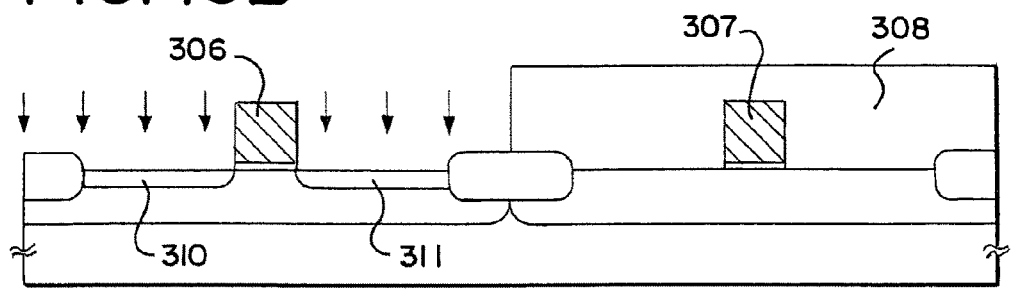

After a field oxide film 304 by conducting a selective oxidization is formed, a 30 nm thick oxide film (gate insulating film in the later step) 305 is formed on a silicon surface by a heating oxidization process. (FIG. 16A)

Next, a first gate electrode 306 and a second gate electrode 307 are formed. In this embodiment, a silicon film having conductivity is used as a material for forming the gate electrodes. However, in addition, an element selected from the group consisting of Ta, W, Ti, Mo, Al, Cu, Cr and Nd, or an alloy material or compound material containing the element as its main constituent can be used.

After the formation of the first gate electrode 306 and the second gate electrode 307, a region that becomes a p-channel MOSFET (on the right side of the figure) is covered with a resist mask 308, and an impurity element imparting n-type conductivity is introduced into the single crystal silicon substrate 301. (FIG. 16B) Any of laser doping, plasma doping, ion implantation and ion shower doping is used as a method of introducing an impurity element, and the introduction is conducted so as to attain a concentration of $5\times10^{18}$ to $1\times10^{19}/$ cm$^3$. In this embodiment, As is used as the impurity element imparting n-type conductivity. Parts of impurity regions 310 and 311 thus formed (end portions on the side that contacts a channel forming region) function as LDD regions of an n-channel MOSFET later.

Next, a region that becomes an n-type channel MOSFET is covered with a resist mask 312. Then, an impurity element imparting p-type conductivity is introduced into the single crystal silicon substrate 301. (FIG. 16C) In this embodiment, B (boron) is used as the impurity element imparting p-type conductivity. In this way, impurity regions 314 and 315 that function as LDD regions of the p-channel MOSFET later are formed.

Figure 16C:
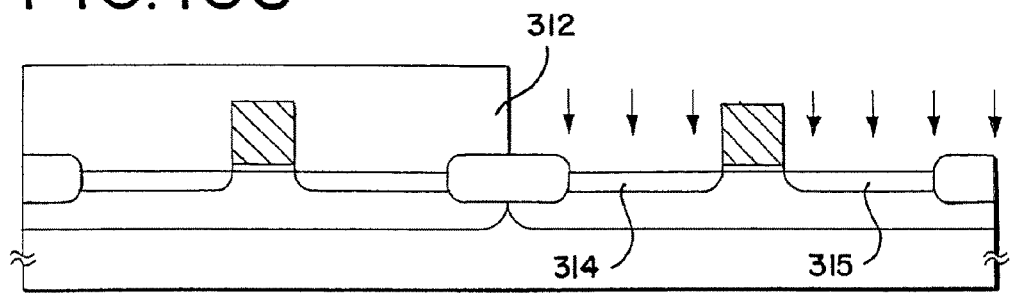
Figure 17A:
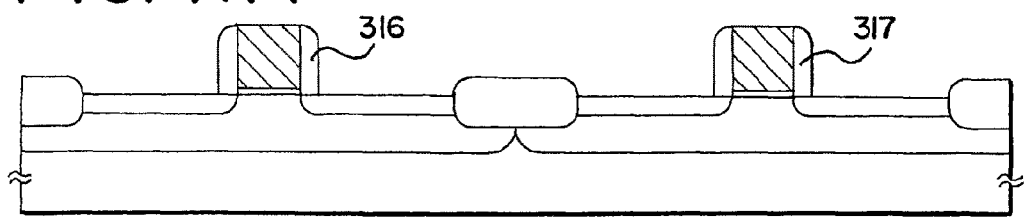
FIGS. 17A to 17C are diagrams showing an example of wiring manufactured in accordance with the present invention.

After the state of FIG. 16C is obtained, then, a silicon oxide film (not shown) is deposited, and etchback is conducted, thereby forming sidewalls 316 and 417. (FIG. 17A)

Figure 17B:
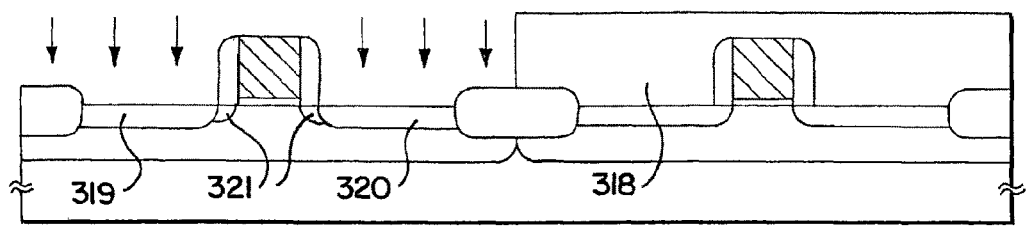

Next, the region that becomes the p-channel MOSFET is covered with a resist mask 318 again, and an impurity element imparting n-type conductivity is introduced with a concentration of $1\times10^{20}/$cm$^3$. Thus, a source region 319 and a drain region 320 are formed, and an LDD region 321 is formed under the sidewall 316. (FIG. 17B)

Similarly, the region that becomes the n-channel MOSFET is covered with a resist mask 322, and an impurity element imparting p-type conductivity is introduced with a concentration of $1\times10^{20}/$cm$^3$. Thus, a drain region 323 and a source region 324 are formed, and an LDD region 325 is formed under the sidewall 317. (FIG. 17C) Further, while the region is covered with the resist mask 322, one or a plurality of elements selected from rare gas elements are introduced. In this way, a larger amount of the impurity element is introduced into the second gate electrode 407 compared with the first gate electrode 306. Thus, the compressive stress in the second gate electrode 307 is stronger than that in the first gate electrode 406, and also, the compressive stress that the channel forming region in the p-channel MOSFET receives is stronger than the compressive stress that the channel forming region in the n-channel MOSFET receives.

Figure 17C:
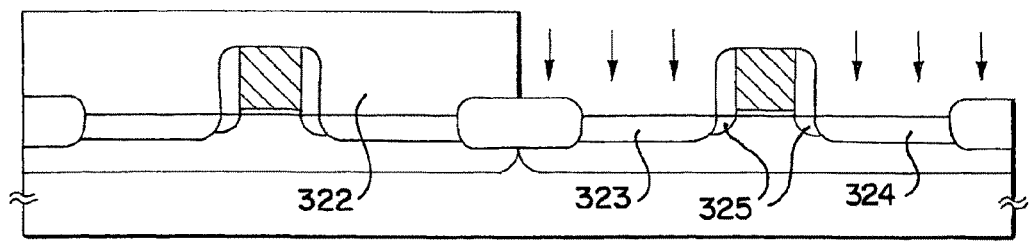

After the state of FIG. 17C is obtained, first heat treatment is conducted to perform activation of the introduced impurity element.

Subsequently, a titanium film is formed, and a second heat treatment is conducted, thereby forming a titanium silicide layer 326 on the source region, the drain region, and the surface of the gate electrode. Of course, metal silicide using other metal film can be formed. After the silicide layer is formed, the titanium film is removed.

Next, the interlayer insulating film 327 is formed, and the contact holes 331, 332, 333, and 334 are opened to form the source electrodes 328, 329, and drain electrode 330. Of course, it is effective to conduct a hydrogenation after forming electrodes. In this embodiment, W film is formed, and the source electrodes 328, 329 and the drain electrode 330 are formed by using ICP etching device. By forming the electrodes in such a manner, the dispersion of width and length of a metal wiring can be decreased.

Figure 18:
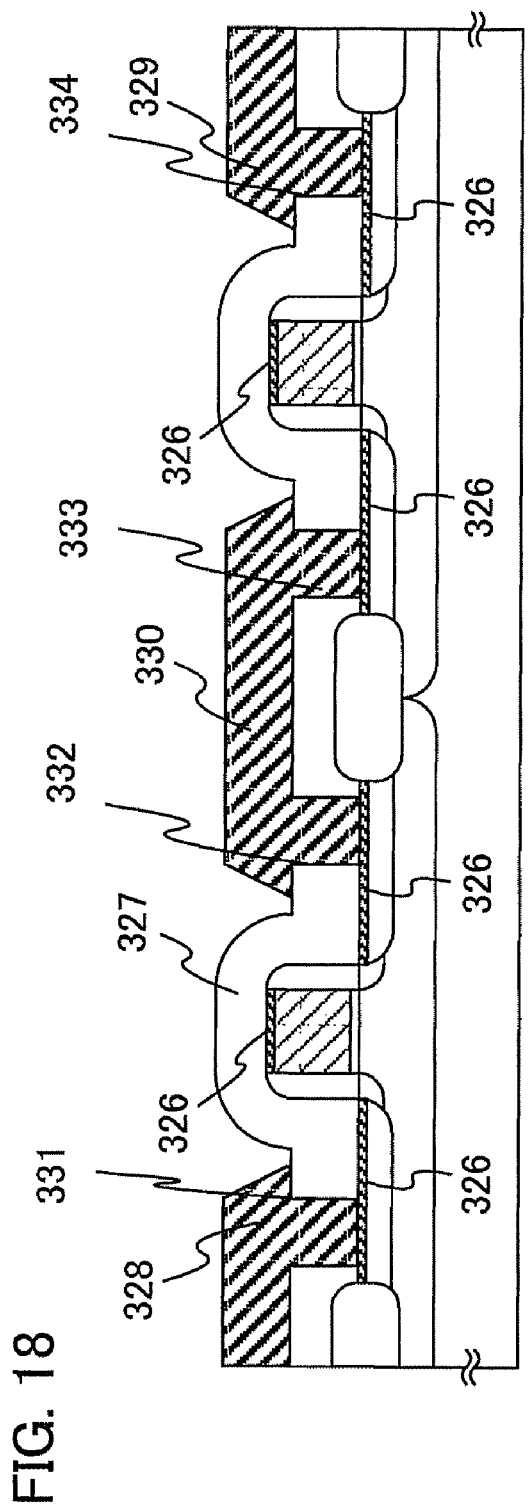
FIG. 18 is a diagram showing an example of wiring manufactured in accordance with the present invention.

Above-mentioned steps, CMOS circuit as shown in FIG. 18 can be obtained. By applying the present invention, the dispersion of the shape of a metal wiring can be decreased. The favorable coverage can be obtained by providing a taper portion at an edge portion of the metal wiring. Moreover, the operation characteristics can also greatly be increased.

This embodiment can be combined with Embodiment 1.
[Embodiment 3]

In this embodiment, a method of manufacturing an active matrix substrate will be described with reference to FIGS. 19A to 22. A substrate on which a CMOS circuit, a driver circuit, and a pixel portion having a pixel TFT and a storage capacitor are formed together is called active matrix substrate for convenience.

First of all, a substrate 400 formed of glass such as barium borosilicate glass and aluminum borosilicate glass, represented by such as Corning #7059 glass and #1737 glass, is used in this example. The substrate 400 may be a quartz substrate, a silicon substrate, a metal substrate or a stainless substrate, which has an insulating film on the surface. The substrate 400 may be a plastic substrate having heat resistance, which withstands a processing temperature in this embodiment.

Next, a primary film 401 having an insulating film such as silicon oxide film, silicon nitride film, and a silicon oxide nitride film is formed on the substrate 400. In this embodiment, a two-layer structure is used for the primary film 401. However, a structure may be used where a single layer film, which is the insulating film itself, or at least two layers are stacked. As a first layer of the primary film 401, a silicon oxide nitride film 401a is formed 10 to 200 nm (preferably 50 to 100 nm) thick by using SiH$_4$, NH$_3$ and N$_2$O as a reaction gas in accordance with the plasma CVD method. In this example, a silicon oxide nitride film 401a (compositional ratio: Si=32%, O=27%, N=24% and H=17%) was formed 50 nm thick. Next, as a second layer of the primary film 401, a silicon oxide nitride film 401b is formed 50 to 200 nm (preferably 100 to 150 nm) thick by using SiH$_4$ and N$_2$O as a reaction gas in accordance with the plasma CVD method. In this example, a silicon oxide nitride film 401b (compositional ratio: Si=32%, O=59%, N=7% and H=2%) is formed 100 nm thick.

Next, semiconductor layers 402 to 406 are formed on the primary film. First of all, semiconductor film is formed 25 to 80 nm thick (preferably 30 to 60 nm) by a publicly known method (such as the sputtering method, LPCVD method and plasma CVD method). Then, the semiconductor film is crystallized by a publicly known method (such as laser crystallization method, heating crystallization method using RTA or a furnace annealing and heating crystallization method using a metal element facilitating the crystallization). Patterning is performed on the obtained crystalline semiconductor film in a desired form in order to form the semiconductor layers 402 to 406. The semiconductor film may be an amorphous semiconductor film, a fine crystal semiconductor film or a crystalline semiconductor film. Alternatively, the semiconductor film may be a compound semiconductor film having an amorphous structure such as an amorphous silicon germanium film. In this embodiment, plasma CVD method is used to form an amorphous silicon film 55 nm thick. Solution containing nickel is held on the amorphous silicon film. After the dehydrogenation is performed on the amorphous silicon film (at 500° C. for one hour), heating crystallization (at 550° C. for four hours) is performed thereon. The semiconductor layers 402 to 406 are formed by performing patterning processing thereon by using the photolithography method.

When a crystalline semiconductor film is produced in accordance with the laser crystallization method, the pulse type or the continuous light-emitting type of excimer laser, YAG laser, YVO$_4$ laser, YLF laser, YAlO$_3$ laser, glass laser, ruby laser or Ti: sapphire laser may be applied. When these types of laser are used, a method is preferable whereby laser light emitted from a laser oscillator is gathered by an optical system and is irradiated to a semiconductor film. The condition of the crystallization may be selected by the operator as necessary. However, when excimer laser is used, the pulse frequency is 300 Hz and the laser energy density is 100 to 700 mJ/cm$^2$ (typically 200 to 300 mJ/cm$^2$). Preferably, when YAG laser is used, the second harmonic is used, and the pulse frequency is 1 to 300 Hz. The laser energy density is preferably 300 to 1000 mJ/cm$^2$ (typically 350 to 800 mJ/cm$^2$). Then, laser light gathered linearly of 100 to 1000 μm wide, or 400 μm wide in this embodiment, is irradiated all over the surface of the substrate. The overlap percentage of the linear beams may be 50 to 98%.

The amorphous silicon film is crystallized by using a metal element facilitating the crystallization in this embodiment. Therefore, the metal element remains the crystalline silicon film. The metal element is removed as follows: First of all, an amorphous silicon film 50 to 100 nm thick is formed on the crystalline silicon film. Then, heating processing (such as RTA method or heating annealing using an annealing furnace) is performed thereon. Then, the metal element is diffused in the amorphous silicon film, and the amorphous silicon is removed by etching after heating processing. Thus, the metal element contained in the crystalline silicon film can be reduced or removed.

After the semiconductor layers 402 to 406 are formed, a small amount of impurity element (boron or phosphorus) may be doped in order to control a threshold value of the TFT.

Next, a gate insulating film 407 covering the semiconductor layers 402 to 406 is formed. The gate insulating film 407 is formed by using insulating film 40 to 150 nm thick containing silicon in accordance with plasma CVD method or sputtering method. In this embodiment, a silicon oxide nitride film (compositional ratio: Si=32%, O=59%, N=7% and H=2%) 110 nm thick is formed in accordance with the plasma CVD method. Notably, the gate insulating film is not limited to the silicon oxide nitride film but an insulating film containing other silicon may be used as a single layer or as laminated layers.

Next, a first conductive film 408, which is 20 to 100 nm thick, and a second conductive film 409, which is 100 to 400 nm thick, is stacked on the gate insulating film 407. In this embodiment, the first conductive film 408 formed by a TaN film 30 nm thick and the second conductive film 409 formed by a W film 370 nm thick are stacked. The TaN film is formed by using Ta target to perform sputtering in an atmosphere containing nitrogen. The W film is formed by using W target to perform sputtering. Alternatively, it can be formed by heating CVD method using 6 tungsten fluoride (WF$_6$). In both cases, the use of the gate electrode needs low resistance. Therefore, the resistivity of the W film is desirably 20 μΩcm or below.

While, in this embodiment, the first conductive film 408 is TaN and the second conductive film 409 is W. They are not limited in particular if the second conductive film is formed by an alloy material or compound material of W or W mainly contained, and if the first conductive film is formed by an alloy material or compound material of Al or Al mainly contained. Both of them can be formed by an element selected from Ta, W, Ti, Mo, Al, Cu, Cr and Nd or an alloy material or a compound material mainly containing the element. Alternatively, a semiconductor film, such as a polycrystalline silicon film to which an impurity element such as phosphorus is doped, can be used. An AgPdCu alloy may be used.

Next, resist masks 410 to 415 using photolithography method are formed, and first etching processing is performed thereon in order to form electrodes and wirings. The first etching processing is performed under first and second etching conditions (FIG. 19B). The first etching condition in this example is to use Inductively Coupled Plasma (ICP) etching and to use CF$_4$ and Cl$_2$ and O$_2$ as an etching gas, whose amount of gases are 25/25/10 (sccm), respectively. 500 W of RF (13.56 MHZ) power was supplied to a coil type electrode by 1 Pa pressure in order to generate plasma and then to perform etching. Here, a dry etching device using ICP (Model E645-£ICP) manufactured by Matsushita Electric Industrial Co., Ltd was used. 150 W of RF (13.56 MHZ) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the resist masks 410 to 415. Then, CF$_4$ and Cl$_2$ are used as etching gases. The ratio of the amounts of flowing gasses is 30/30 (sccm). 500 W of RF (13.56 MHZ) power is supplied to a coil type electrode by 1 Pa pressure in order to generate plasma and then to perform etching for amount 30 seconds. 20 W of RF (13.56 MHZ) power is also supplied to a substrate side (test sample stage) and substantially negative self-bias voltage is applied. Under the second etching condition where CF$_4$ and Cl$_2$ are mixed, both W film and TaN film were etched to the same degree. In order to etch without leaving a residue on the gate insulating film, the etching time may be increased 10 to 20% more.

In the first etching processing, when the form of the resist mask is appropriate, the form of the ends of the first and the second conductive layers are in the tapered form due to the effect of the bias voltage applied to the substrate side. The angle of the tapered portion is 15 to 45°. Thus, conductive layers 417 to 422 in a first form are formed which include the first conductive layers and the second conductive layers (first conductive layers 417a to 422a and second conductive layer 417b to 422b) through the first etching processing. In a gate insulating film 416, an area not covered by the first conductive layers 417 to 422 is etched by about 20 to 50 nm so as to form a thinner area.

Next, second etching processing is performed without removing resist masks (FIG. 19C). Here, CF$_4$, Cl$_2$ and O$_2$ are used to etch the W film selectively. Then, second conductive layers 428b to 433b are formed by the second etching processing. On the other hand, the first conductive layers 417a to 422a are hardly etched, and conductive layers 428 to 433 in the second form are formed.

In the conductive films 428 to 433 formed in such a manner, the dispersion of shape is decreased in the face of the substrate.

First doping processing is performed without removing resist masks and low density of impurity element, which gives n-type to the semiconductor layer, is added. The doping processing may be performed in accordance with the ion-doping method or the ion-implanting method. The ion doping method is performed under a condition in the dose of $1\times10^{13}$ to $5\times10^{14}$/cm$^2$ and the accelerating voltage of 40 to 80 keV. In this embodiment, the ion doping method is performed under a condition in the dose of $1.5\times10^{13}$/cm$^2$ and the accelerating voltage of 60 keV. The n-type doping impurity element may be Group 15 elements, typically phosphorus (P) or arsenic (As). Here, phosphorus (P) is used. In this case, the conductive layers 428 to 433 function as masks for the n-type doping impurity element. Therefore, impurity areas 423 to 427 are formed in the self-alignment manner. An n-type doping impurity element in the density range of $1\times10^{18}$ to $1\times10^{20}$/cm$^3$ is added to the impurity areas 423 to 427.

When resist masks are removed, new resist masks 434a to 434c are formed. Then, second doping processing is performed by using higher accelerating voltage than that used in the first doping processing. The ion doping method is performed under a condition in the dose of $1\times10^{13}$ to $1\times10^{15}$/cm$^2$ and the accelerating voltage of 60 to 120 keV. In the doping processing, the second conductive layers 428b to 432b are used as masks against the impurity element. Doping is performed such that the impurity element can be added to the semiconductor layer at the bottom of the tapered portion of the first conductive layer. Then, third doping processing is performed by having lower accelerating voltage than that in the second doping processing to obtain a condition shown in FIG. 20A. The ion doping method is performed under a condition in the dose of $1\times10^{15}$ to $1\times10^{17}$/cm$^2$ and the accelerating voltage of 50 to 100 keV. Through the second doping processing and the third doping processing, an n-type doping impurity element in the density range of $1\times10^{18}$ to $5\times10^{19}$/cm$^3$ is added to the low density impurity areas 436, 442 and 448, which overlap with the first conductive layer. An n-type doping impurity element in the density range of $1\times10^{19}$ to $5\times10^{21}$/cm$^3$ is added to the high density impurity areas 435, 441, 444 and 447.

With proper accelerating voltage, the low density impurity area and the high density impurity area can be formed by performing the second doping processing and the third doping processing at once.

Next, after removing resist masks, new resist masks 450a to 450c are formed to perform the fourth doping processing. Through the fourth doping processing, impurity areas 453, 454, 459 and 460, to which an impurity element doping a conductive type opposite to the one conductive type is added, in a semiconductor layer, which is an active layer of a p-channel type TFT. Second conductive layers 428a to 432a are used as mask against the impurity element, and the impurity element giving p-type is added so as to form impurity areas in the self-alignment manner. In this embodiment, the impurity areas 453, 454, 456, 459 and 460 are formed by applying ion-doping method using diborane (B$_2$H$_6$) (FIG. 20B). During the fourth doping processing, the semiconductor layer forming the n-channel TFT is covered by resist masks 450a to 450c. Thorough the first to the third doping processing, phosphorus of different densities is added to each of the impurity areas 439, 447 and 448. Doping processing is performed such that the density of p-type doping impurity element can be $1\times10^{19}$ to $5\times10^{21}$ atoms/cm$^3$ in both areas. Thus, no problems are caused when they function as the source region and the drain region of the p-channel TFT.

Impurity areas are formed in the semiconductor layers, respectively, through the processes above. The dispersion of length and width of the low impurity element and the channel formation region, because the dispersion of shape of the conductive film is decreased in the face of the substrate.

Next, the resist masks 450a to 450c are removed and a first interlayer insulating film 461 is formed thereon. The first interlayer insulating film 461 may be an insulating film 100 to 200 nm thick containing silicon, which is formed by plasma CVD method or sputtering method. In this embodiment, silicon oxide nitride 150 nm thick is formed by plasma CVD method. The first interlayer insulating film 461 is not limited to the silicon oxide nitride film but may be the other insulating film containing silicon in a single layer or in laminated layers.

Next, as shown in FIG. 20C, a heating processing is performed to recover the crystalline characteristic of the semiconductor layers and to activate the impurity element added to each of the semiconductor layer. The heating processing is performed by heating annealing method using an annealing furnace. The heating annealing method may be performed in an atmosphere of nitrogen with the oxygen density of 1 ppm or below, preferably 0.1 ppm or below, at 400 to 700° C., typically at 500 to 550° C. In this embodiment, the activation processing is performed through heating processing at 550° C. for four hours. In addition to the heating annealing method, laser annealing method or rapid heating annealing method (RTA method) may be applied.

Alternatively, the heating processing may be performed before the first interlayer insulating film is formed. However, when a wiring material in use is sensitive to heat, the activation processing is preferably performed after an inter-layer insulating film (insulating film mainly containing silicon such as silicon nitride film) for protecting the wirings like this embodiment.

After the heating processing (heating processing at 300 to 550° C. for 1 to 12 hours) is performed, hydrogenation can be performed. This process terminates the dangling bond of the semiconductor layer with hydrogen contained in the first interlayer insulating film 461. The semiconductor layer can be hydrogenated regardless of the existence of the first interlayer insulating film. Alternatively, the hydrogenation may be plasma hydrogenation (using hydrogen excited by plasma) or heating processing in an atmosphere containing 3 to 100% of hydrogen at 300 to 450° C. for 1 to 12 hours.

When laser annealing method is used for the activation processing, laser light such as excimer laser and YAG laser is desirably irradiated after the hydrogenation is performed.

Next, a second interlayer insulating film 462 formed by a inorganic insulating material or an organic insulating material is formed on the first interlayer insulating film 461. In this embodiment, an acrylic resin film 1.6 μm thick is formed, whose viscosity is 10 to 1000 cp, preferably 40 to 200 cp and which has depressions and projections formed on the surface.

In this embodiment, in order to prevent mirror reflection, a second interlayer insulating film having projections and depressions on the surface is formed. Thus, the projections and depressions are formed on the surface of the pixel electrode. In order to obtain an effect of light dispersion by forming the depressions and projections on the surface of the pixel electrode, a projecting portion may be formed under the pixel electrode. In this case, the projecting portion can be formed by using the same mask for forming a TFT. Thus, the projecting portion can be formed without any increase in the number of steps. The projecting portion may be provided as necessary on the substrate in the pixel area except for wirings and the TFT portion. Accordingly, projections and depressions can be formed on the surface of the pixel electrode along the projections and depressions formed on the surface of an insulating film covering the projecting portion.

Alternatively, the second interlayer insulating film 462 may be a film having a flattened surface. In this case, after the pixel electrode is formed, projections and depressions are formed on the surface by performing an added process such as publicly known sandblast method and etching method. Preferably, by preventing mirror reflection and by dispersing reflected light, the whiteness is increased.

Figure 21:
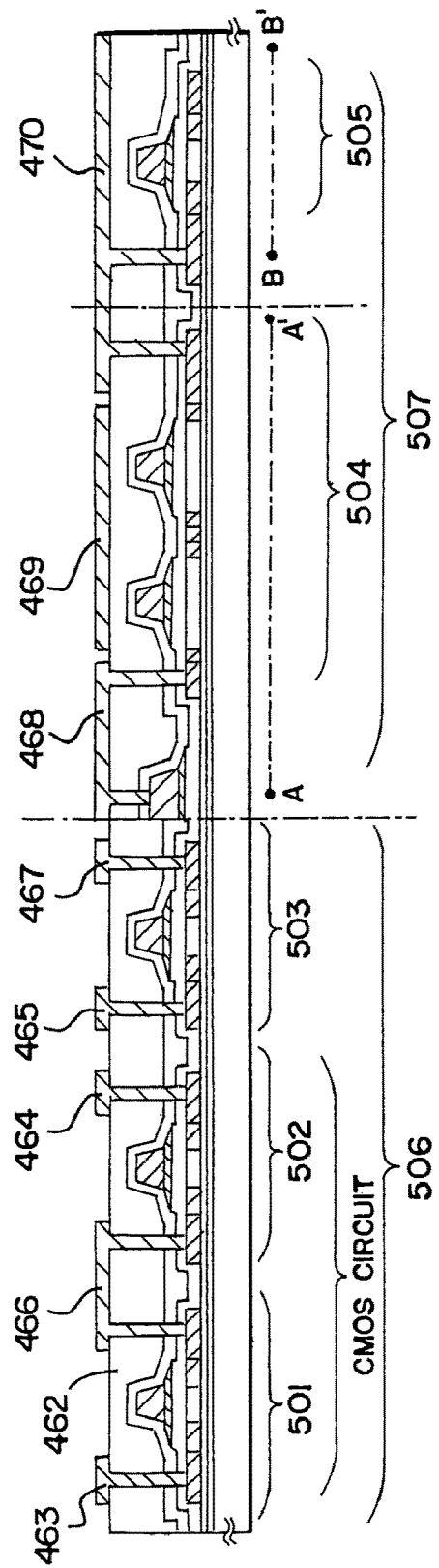
FIG. 21 is a sectional view showing a process of manufacturing a pixel TFT and driving circuit TFTs.

Wirings 463 to 467 electrically connecting to impurity areas, respectively, are formed in a driver circuit 506. These wirings are formed by patterning a film laminating a Ti film 50 nm thick and an alloy film (alloy film of Al and Ti) 500 nm thick. It is not limited to the two-layer structure but may be a single layer structure or a laminate film including three or more layers. The materials of the wirings are not limited to Al and Ti. For example, the wiring can be formed by forming Al or Cu on a TaN film and then by patterning the laminate film in which a Ti film is formed. (FIG. 21)

In a pixel portion 507, a pixel electrode 470, a gate wiring 469 and a connecting electrode 468 are formed. Source wirings (a laminate of layers 443a and 443b) are electrically connected with a pixel TFT by the connecting electrode 468. The gate wiring 469 is electrically connected with a gate electrode of the pixel TFT. A pixel electrode 470 is electrically connected with a drain region 442 of the pixel TFT. Furthermore, the pixel electrode 470 is electrically connected with a Semiconductor layer 458 functioning as one electrode forming a storage capacitor. Desirably, a material having excellent reflectivity such as a film mainly containing Al or Ag or the laminate film is used for the pixel electrode 470.

In this way, the driver circuit 506 having a CMOS circuit which includes an n-channel TFT 501 and a p-channel TFT 502, and an n-channel TFT 503, and the pixel portion 507 having the pixel TFT 504 and the storage capacitor 505 can be formed on the same substrate. Thus, an active matrix substrate is completed.

The n-channel TFT 501 of the driver circuit 506 has a channel formed area 437, a low density impurity area 436 overlapping with the first conductive layer 428a, which constructs a part of the gate electrode, (GOLD area) and a high density impurity area 452 functioning as the source region or the drain region are implanted. The p-type channel TFT 502 forming a CMOS circuit together with the n-channel TFT 501, which are connected by an electrode 466, has a channel formed area 440, a high density impurity area 454 functioning as the source region or the drain region, and an impurity area 453 to which an n-type doping impurity element and a p-type doping impurity element are implanted. The n-channel TFT 503 has a channel formed area 443, a low density impurity area 442 overlapping with the first conductive layer 430a, which constructs a part of the gate electrode, (GOLD area), a high density impurity area 456 functioning as the source region or the drain region are implanted.

The pixel TFT 504 of the pixel portion has a channel formed area 446, a low density impurity area 445 formed outside of the gate electrode (LDD region) and a high density impurity area 458 functioning as the source region or the drain region are implanted. An n-type doping impurity element and a p-type doping impurity element are added to a semiconductor layer functioning as one electrode of the storage capacitor 505. The storage capacitor 505 is formed by an electrode (a laminate of layers 432a and 432b) and a semiconductor layer by using the insulating film 416 as a dielectric.

The pixel structure in this embodiment is arranged such that light can be blocked in a space between pixel electrodes and the ends of the pixel electrodes can overlap with the source wiring without using the black matrix.

Figure 22:
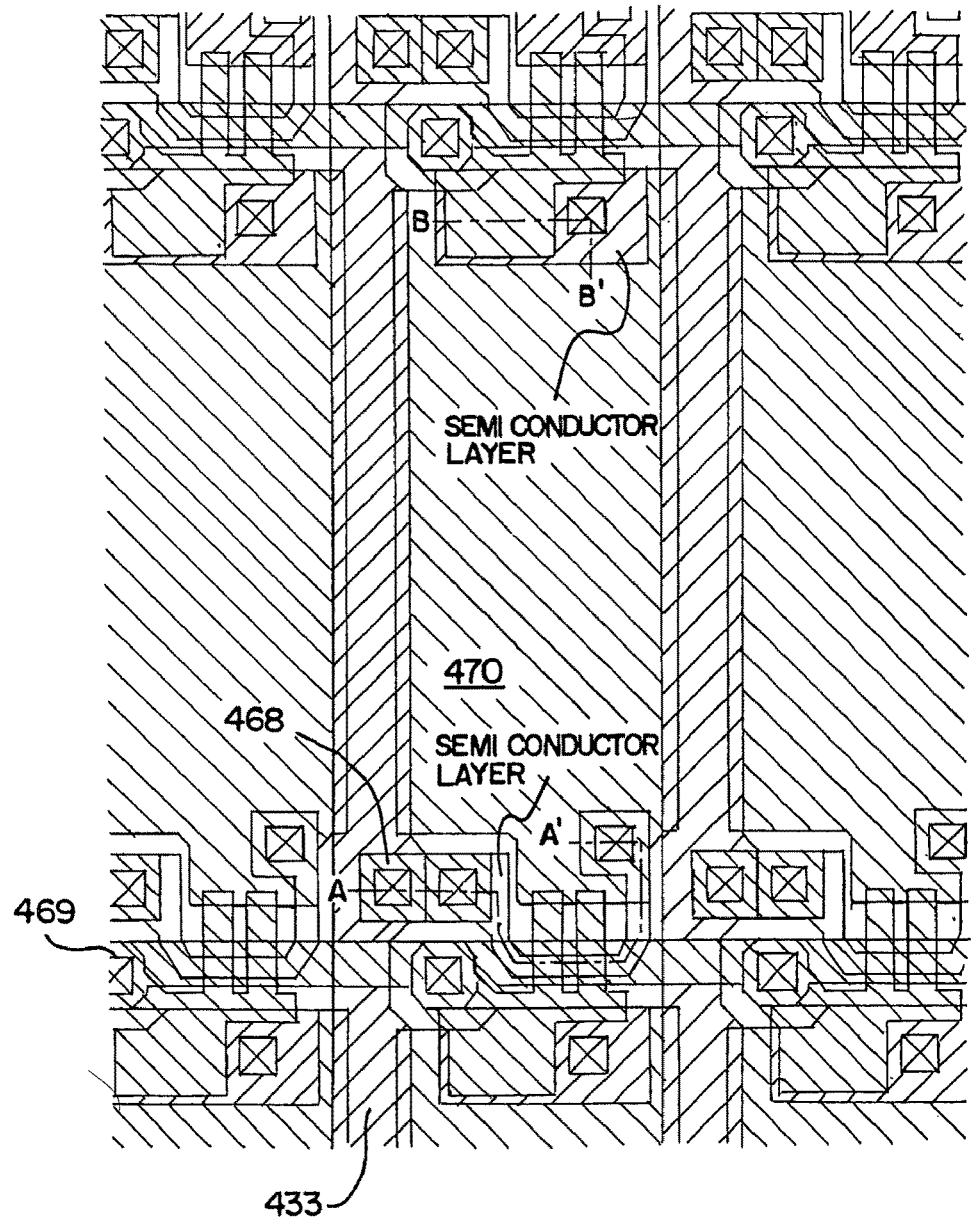
FIG. 22 is a top view showing the structure of a pixel TFT.

FIG. 22 shows a top view of the pixel portion of the active matrix substrate produced in this embodiment. The same reference numerals are used for the corresponding parts in FIGS. 19 to 22. A broken line A-A' in FIG. 21 corresponds to a sectional view taken along a broken line A-A' in FIG. 22. A broken line B-B' in FIG. 21 corresponds to a sectional view taken along a broken line B-B' in FIG. 22.

It should be noted that this embodiment can be combined with Embodiment 1.

[Embodiment 4]

Figure 23:
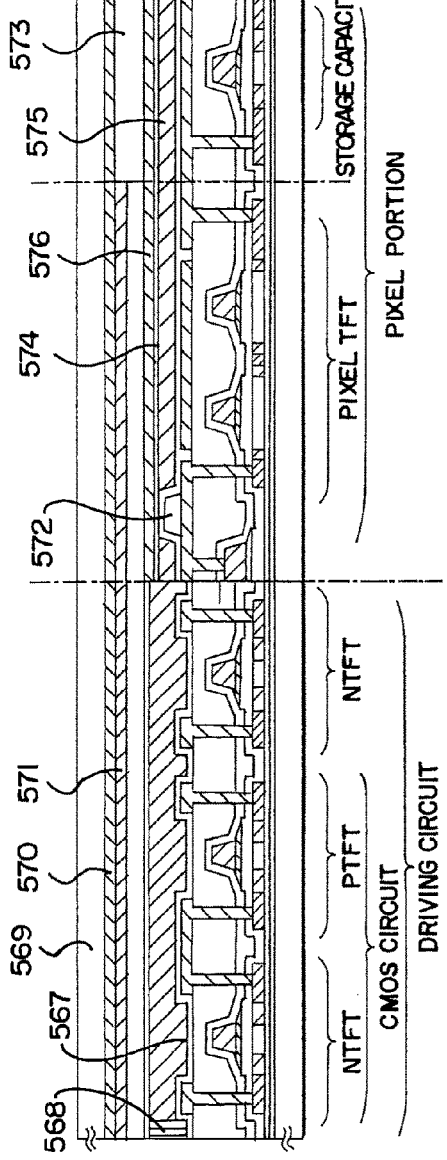
FIG. 23 is a sectional view showing a process of manufacturing an active matrix liquid crystal display device.

This embodiment describes, below, a process to manufacture a reflection type liquid crystal display device from the active matrix substrate formed in Embodiment 3, using FIG. 23.

First, after obtaining an active matrix substrate in the state of FIG. 21 according to Embodiment 3, an orientation film 567 is formed at least on the pixel electrodes is 470 on the active matrix substrate of FIG. 21 and subjected to a rubbing process. Incidentally, in this embodiment, prior to forming an orientation film 567, an organic resin film such as an acryl resin film is patterned to form columnar spacers 572 in a desired position to support the substrates with interval. Meanwhile, spherical spacers, in place of the columnar spacers, may be distributed over the entire surface of the substrate.

Then, a counter substrate 569 is prepared. Then, a coloring layer 570, 571 and a planarizing film 573 are formed on a counter substrate 569. A shield portion is formed by overlapping a red coloring layer 570 and a blue coloring layer 571 together. Meanwhile, the shield portion may be formed by partly overlapping a red coloring layer and a green coloring layer.

In this example, the substrate shown in Embodiment 3 is used. Accordingly, in FIG. 22 showing a top view of the pixel portion of Embodiment 3, there is a need to shield at least the gap between the gate wiring 469 and the pixel electrode 470, the gap between the gate wiring 469 and the connecting electrode 468, and the gap between the connecting electrode 468 and the pixel electrode 470. In this embodiment, the counter substrate and the active matrix substrate were bonded together by arranging the coloring layers so that the shielding portion having a lamination of coloring layers is overlapped with the portion that must be shielded.

In this manner, the gaps between the pixels are shielded by the shielding portion having a lamination of coloring layers without forming a shielding layer such as a black mask, thereby enabling to reduce the number of processes.

Then, a counter electrode 576 of a transparent conductive film is formed on the planarizing film 573 at least in the pixel portion. An orientation film 574 is formed over the entire surface of the counter substrate and subjected to a rubbing process.

Then, the active matrix substrate formed with the pixel portion and driver circuit and the counter substrate are bonded together by a seal member 568. The seal member 568 is mixed with filler so that the filler and the columnar spacers bond together the two substrates at regular intervals. Thereafter, a liquid crystal material 575 is poured between the substrates, and completely sealed by a sealant (not shown). The liquid crystal material 575 may be a known liquid crystal material. In this manner, completed is a reflection type liquid crystal display device shown in FIG. 23. If necessary, the active matrix substrate or counter substrate is divided into a desired shape. Furthermore, a polarizing plate (not shown) is bonded only on the counter substrate. Then, an FPC is bonded by a known technique.

The liquid crystal display panel manufactured as above can be offer an excellent operation characteristic, because a dispersion of width and length of the channel formation region and the low density impurity element region is decreased according to decreasing a dispersion of shape of the conductive layer. Such liquid crystal panel can be used as a display portion for an electronic appliances in various kinds.

Incidentally, this embodiment can be freely combined with Embodiments 1 to 3.

[Embodiment 5]

In this embodiment, an example in which a light emitting device is manufactured according to the present invention will be described. In this specification, the light emitting device is a generic name for a display panel in which a light emitting element formed over a substrate is sealed between the substrate and a cover member and a display module in which an IC is mounted on the display panel. Note that the light emitting element has a layer (light emitting layer) including an organic compound such that electro luminescence (EL) produced by applying an electric field thereto is obtained, an anode layer, and a cathode layer. As the electro luminescence in the organic compound, there are light emission (fluorescence) produced when it is returned from a singlet excitation state to a ground state and light emission (phosphorescence) produced when it is returned from a triplet excitation state to a ground state. The electro luminescence includes either light emission or both light emissions.

In the light emitting element, all layers formed in an anode and a cathode are defined as an organic compound layer. The organic compound layer specifically includes a light emitting layer, a hole injection layer, an electron injection layer and a hole transportation layer. Basically, the light emitting element has a structure in which an anode layer, a light emitting layer and a cathode layer are laminated sequentially. In addition to the structure, the light emitting element have also a structure in which an anode layer, a hole injection layer, a light emitting layer and a cathode layer are laminated, and a structure in which an anode layer, a hole injection layer, a light emitting layer, an electron transporting layer and a cathode layer are laminated sequentially.

Figure 24:
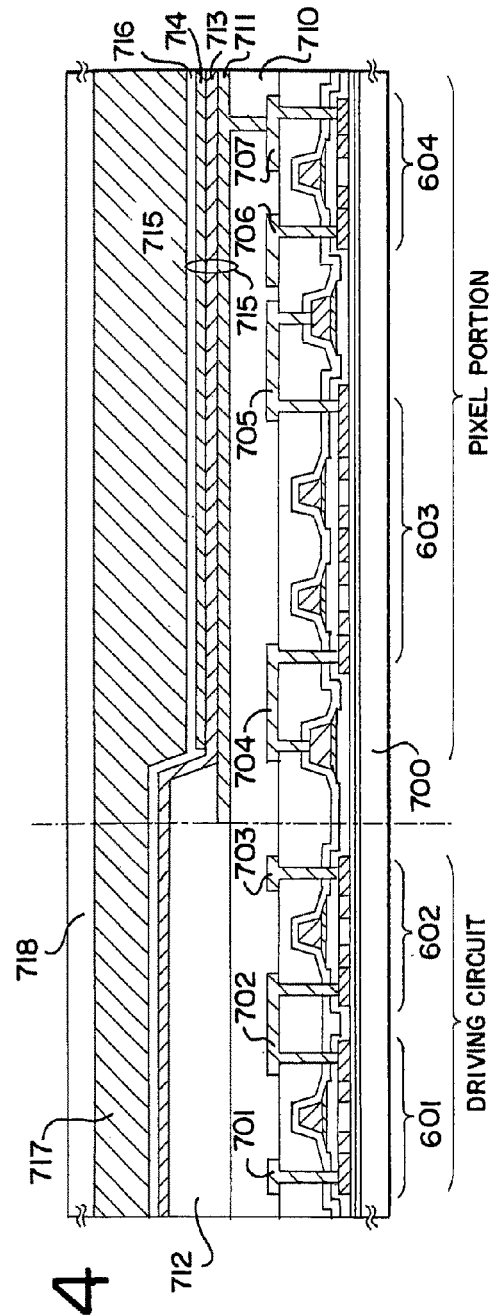
FIG. 24 is a structural diagram showing in section a driving circuit and a pixel portion of a light emitting device.

FIG. 24 is a cross sectional view of a light emitting device of this embodiment. In FIG. 24, a switching TFT 603 provided on a substrate 700 is made from the n-channel TFT 503 shown in FIG. 21. Thus, its structure will be described with reference to the description of the n-channel TFT 503.

Note that, in this embodiment, a double gate structure in which two channel forming regions are formed is used. However, a single gate structure in which one channel forming region is formed or a triple gate structure in which three channel is forming regions are formed may be used.

A driver circuit provided on the substrate 700 is made from the CMOS circuit shown in FIG. 21. Thus, its structure will be described with reference to the descriptions of the n-channel TFT 501 and the p-channel TFT 502. Note that a single gate structure is used in this embodiment. However, a double gate structure or a triple gate structure may be used.

Wirings 701 and 703 serve as source wirings of the CMOS circuit and a wiring 702 serves as a drain wiring. In addition, a wiring 704 serves as a wiring for electrically connecting a source wiring 708 with the source region of the switching TFT and a wiring 705 serves as a wiring for electrically connecting a drain wiring 709 with the drain region of the switching TFT.

Note that a current control TFT 604 is made from the p-channel TFT 502 shown in FIG. 21. Thus, its structure will be described with reference to the description of the p-channel TFT 502. Note that a single gate structure is used in this embodiment. However, a double gate structure or a triple gate structure may be used.

A wiring 706 is a source wiring (corresponding to a current supply line) of the current control TFT. Reference numeral 707 denotes an electrode electrically connected with a pixel electrode 710 by overlapping it on the pixel electrode 710 of the current control TFT.

Note that reference numeral 710 denotes the pixel electrode (anode of a light emitting element) made from a transparent conductive film. A compound of indium oxide and tin oxide, a compound of indium oxide and zinc oxide, zinc oxide, tin oxide, or indium oxide can be used for the transparent conductive film. In addition, the transparent conductive film to which gallium is added may be used. The pixel electrode 710 is formed on a flat interlayer insulating film 711 before the above wirings are formed. In this embodiment, it is very important to remove a step due to the TFT using a planarizing film 711 made of a resin and thus to planarize the surface. Since a light emitting layer formed later is very thin, there is the case where light emission failure is caused by the step. Thus, it is desirable that the surface is flattened before the formation of the pixel electrode so that the light emitting layer may have its surface flattened as much as possible.

After the formations of the wirings 701 to 707, a bank 712 is formed as shown in FIG. 24. The bank 712 may be formed by patterning an insulating film including silicon or an organic resin film, having a thickness of 100 nm to 400 nm.

Note that since the bank 712 is an insulating film, the attention to an electrostatic discharge damage of an element in film formation is required. In this embodiment, a carbon particle or a metallic particle is added into the insulating film as a material for the bank 712 to reduce the resistivity, and thus the generation of static electricity is suppressed. At this time, the amount of carbon particle or metallic particle to be added is preferably controlled such that the resistivity is $1\times10^6$ to $1\times10^{12}$ $\Omega m$ (preferably, $1\times10^8$ to $1\times10^{10}$ $\Omega m$).

A light emitting layer 713 is formed on the pixel electrode 710. Note that, although only one pixel is shown in FIG. 24, light emitting layers corresponding to respective colors of R (red), G (green), and B (blue) are separately formed in this embodiment. In addition, in this embodiment, a low molecular system organic light emitting material is formed by an evaporation method. Specifically, a laminate structure is used such that a copper phthalocyanine (CuPc) film having a thickness of 20 nm is provided as a hole injection layer and a tris-8-quinolinolato aluminum complex ($Alq_3$) film having a thickness of 70 nm is provided thereon as the light emitting layer. When a fluorescent coloring matter such as quinacridon, perylene, or DCM1 is added to $Alq_3$, a light emitting color can be controlled.

Note that the above materials are examples of the organic light emitting materials which can be used for the light emitting layer and the present invention is not limited to these materials. The light emitting layer (layer for effecting light emission and carrier transfer therefore) may be preferably formed by freely combining a light emitting layer, a charge transport layer, and a charge injection layer. For example, in this embodiment, an example in which the low molecular system organic light emitting material is used as the light emitting layer is described. However, a middle molecular system organic light emitting material or a polymer system organic light emitting material may be used. In this embodiment, an organic light emitting material which has no sublimation property and in which the number of molecules is 20 or smaller or a length of linked molecules is 10 μm or shorter is used as the middle molecular system organic light emitting material. With respect to an example in which the polymer system organic light emitting material is used, a laminate structure may be used such that a polythiophene (PEDOT) film having a thickness of 20 nm is provided as the hole injection layer by a spin coating method and a paraphenylenevinylene (PPV) film having a thickness of about 100 nm is provided thereon as the light emitting layer. When a π conjugate system polymer of PPV is used, a light emitting wavelength from red color to blue color can be selected. An inorganic material such as silicon carbide can be also used for the charge transport layer or the charge injection layer. Known materials can be used as the organic light emitting material and the inorganic material.

Then, a cathode 714 made from a conductive film is provided on the light emitting layer 713. In the case of this embodiment, an alloy film of aluminum and is lithium is used as the conductive film. Of course, a known MgAg film (alloy film of magnesium and silver) may be used. A conductive film made of an element belonging to group 1 or group 2 of the periodic table or a conductive film to which the element is added may be used as a cathode material.

When the cathode 714 is formed, a light emitting element 715 is completed. Note that the light emitting element 715 described here indicates a diode composed of the pixel electrode (anode) 710, the light emitting layer 713, and the cathode 714.

It is effective to provide a passivation film 716 so as to completely cover the light emitting element 715. The passivation film 716 is made from an insulating film including a carbon film, a silicon nitride film, or a silicon oxynitride film and used as a single layer of the insulating film or a laminate as a combination thereof.

At this time, a film having high coverage is preferably used as the passivation film and it is effective to use a carbon film, particularly, a DLC (diamond-like carbon) film. Since the DLC film can be formed in a temperature range of a room temperature to 100° C., it can be easily formed over the light emitting layer 713 having a low heat resistance. In addition, the DLC film has a high blocking effect to oxygen and thus the oxidation of the light emitting layer 713 can be suppressed. Therefore, a problem such as the light emitting layer 713 is oxidized during a sealing step followed by this step can be solved.

Further, a sealing member 717 is provided on the passivation film 716 and a cover member 718 is bonded thereto. An ultraviolet curable resin may be used as the sealing member 717 and it is effective provide a material having a moisture absorption effect or a material having an anti-oxidant effect in the inner portion. In this embodiment, a glass substrate, a quartz substrate, or a plastic substrate (including a plastic film), in which a carbon film (preferably, a diamond-like carbon film) is formed on both surfaces is used as the cover member 718.

Thus, a light emitting device having the structure as shown in FIG. 14 is completed. Note that, it is effective that steps until the passivation film 716 is formed after the formation of the bank 712 are performed in succession without exposure to air by using a multi-chamber system (or in-line system) film formation apparatus. Further, subsequent steps up to bonding of the cover member 718 can be also performed in succession without exposure to air.

Thus, n-channel TFTs 601 and 602, a switching TFT (n-channel TFT) 603, and a current control TFT (n-channel TFT) 604 are formed over the substrate 700.

Further, as described using FIG. 24, when the impurity regions overlapped with the gate electrode through the insulating film are provided, the n-channel TFT resistant to deterioration caused due to a hot carrier effect can be formed. Thus, the light emitting device having high reliability can be realized.

In addition, in this embodiment, the structures of the pixel portion and the driver circuit are only described. However, according to the manufacturing steps of this embodiment, logical circuits such as a signal separating circuit, a D/A converter, an operational amplifier, a γ correction circuit, and the like can be also formed on the same insulator. In addition, a memory and a microprocessor can be formed.

A light emitting device of this embodiment after a sealing (or enclosure) step for protecting the light emitting element is performed will be described using FIGS. 25A and 25B. Note that reference symbols used in FIG. 24 are referred to if necessary.

Figure 25A:
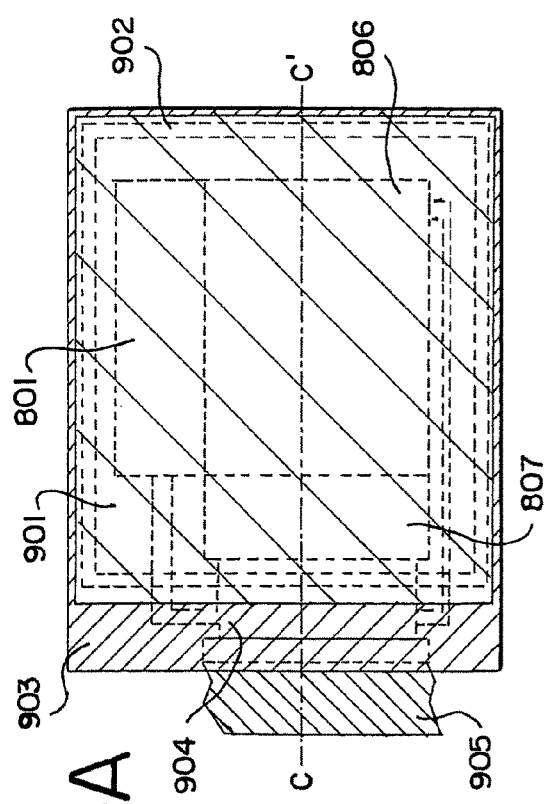
FIG. 25A is a top view of a light emitting device.
Figure 25B:
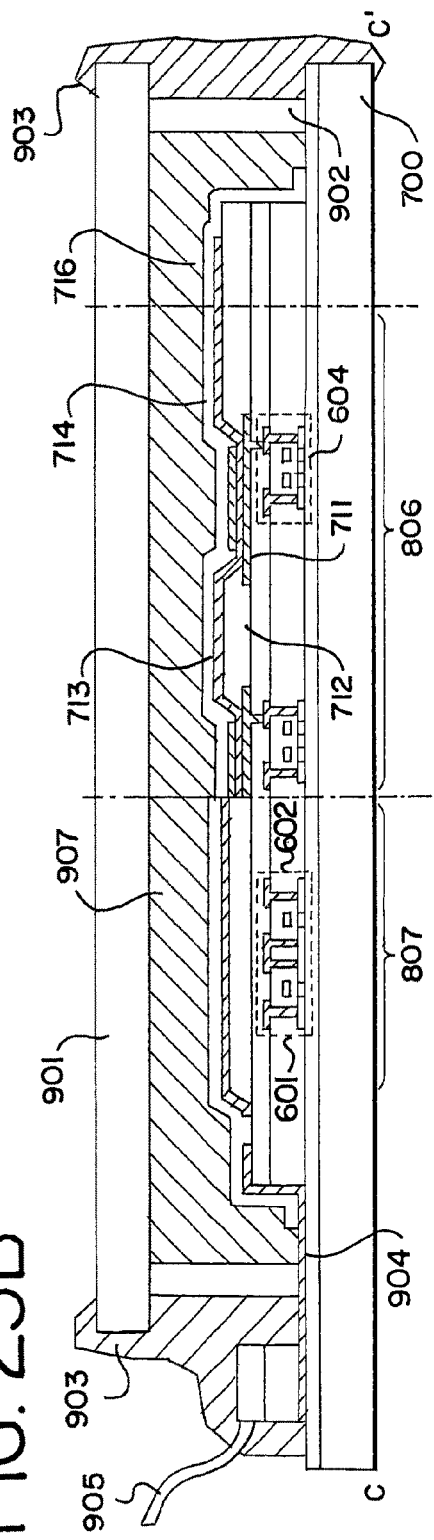
FIG. 25B is a structural diagram showing in section a driving circuit and a pixel portion of the light emitting device.

FIG. 25A is a top view showing a state after the sealing of the light emitting element and FIG. 25B is a cross sectional view obtained by cutting FIG. 25A along the line C-C'. Reference numeral 801 indicated by a dot line denotes a source side driver circuit, 806 denotes a pixel portion, and 807 denotes a gate side driver circuit. In addition, reference numeral 901 denotes a cover member, 902 denotes a first seal member, and 903 denotes a second seal member. A sealing member 907 is provided in the inside portion surrounded by the first seal member 902.

Note that reference numeral 904 denotes a wiring for transmitting signals inputted to the source side driver circuit 801 and the gate side driver circuit 807. The wiring 904 receives a video signal and a clock signal from an FPC (flexible printed circuit) 905 serving as an external input terminal. Although only the FPC is shown here, a printed wiring board (PWB) may be attached to the FPC. The light emitting device in this specification includes not only a main body of the light emitting device but also the light emitting device to which the FPC or the PWB is attached.

Next, the cross sectional structure will be described using FIG. 25B. The pixel portion 806 and the gate side driver circuit 807 are formed over the substrate 700. The pixel portion 806 is composed of a plurality of pixels each including the current control TFT 604 and the pixel electrode 710 electrically connected with the drain thereof. The gate side driver circuit 807 is composed of a CMOS circuit (see FIG. 20) in which the n-channel TFT 601 and the p-channel TFT 602 are combined with each other.

The pixel electrode 710 serves as the anode of the light emitting element. The banks 712 are formed in both ends of the pixel electrode 710. The light emitting layer 713 and the cathode 714 of the light emitting element are formed on the pixel electrode 710.

The cathode 714 also serves as a wiring common to all pixels and is electrically connected with the FPC 905 through a connection wiring 904. All elements, which are included in the pixel portion 806 and the gate side driver circuit 807, are covered with the cathode 714 and a passivation film 716.

In addition, the cover member 901 is bonded to the resultant substrate through the first seal member 902. Note that a spacer made from a resin film may be provided to keep an interval between the cover member 901 and the light emitting element. The sealing member 907 is filled inside the first seal member 902. An epoxy system resin is preferably used for the first seal member 902 and the sealing member 907. The first seal member 902 is desirably made of a material that does not transmit moisture and oxygen as much as possible. A material having a moisture absorption effect or a material having an anti-oxidant effect may be included in the inner portion of the sealing member 907.

The sealing member 907 provided so as to cover the light emitting element also serves as an adhesive for bonding of the cover member 901. In addition, in this embodiment, FRP (fiberglass-reinforced plastics), PVF (polyvinylfuroride), Mylar, polyester, or acrylic can be used as a plastic material 901a of the cover member 901.

In addition, after bonding of the cover member 901 using the sealing member 907, the second seal member 903 is provided so as to cover side surfaces (exposed surface) of the sealing member 907. The second seal member 903 can be made of the same material as the first seal member 902.

With the above structure, when the light emitting element is sealed with the sealing member 907, the light emitting element can be completely shut from the outside and it can be prevented that a substance such as moisture or oxygen which promotes deterioration due to oxidation of the light emitting layer is entered from the outside. Therefore, the light emitting device having high reliability is obtained.

The light emitting device formed in such a manner can be offered an excellent operation characteristics, because a dispersion of width and length of the channel formation region and the low density impurity element region is decreased according to decreasing a dispersion of shape of the conductive layer. Such liquid crystal panel can be used as a display portion for electronic appliances in various kinds.

Note that this embodiment can be freely combined with Embodiments 1 to 3.

[Embodiment 6]

The various electro-optical devices (active matrix liquid crystal display device, active matrix light emitting device, and active matrix EC display device) can be manufactured by applying the present invention. Thus, the present invention can be implemented to every electronic apparatus in which the electro-optical device incorporated in the display portion.

As such electronic apparatus, there are pointed out a video camera, a digital camera, a projector, a head mount display (goggle type display), a car navigation, a car stereo, a personal computer, a portable information terminal (mobile computer, cellular phone or electronic book) and the like. Examples of these are shown in FIGS. 26A to 28C.

Figure 26A:
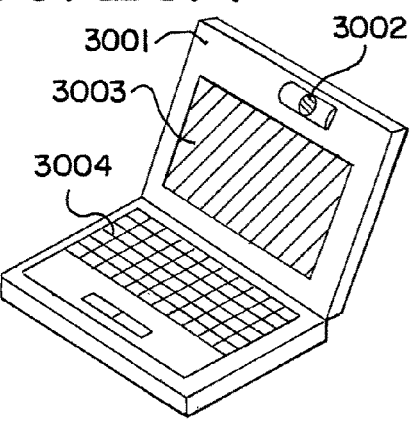
FIGS. 26A to 26F are diagrams showing examples of semiconductor device.

FIG. 26A shows a personal computer including a main body 3001, an image input portion 3002, a display portion 3003 and a keyboard 3004. The present invention can applied to the display portion 3003.

Figure 26B:
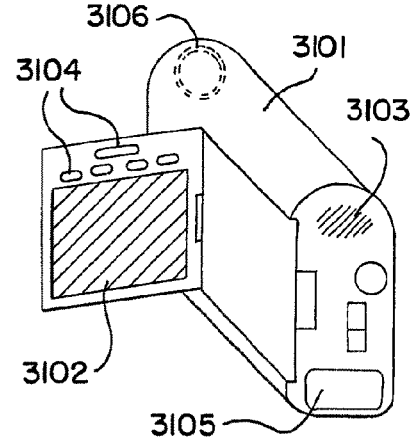

FIG. 26B shows a video camera including a main body 3101, a display portion 3102, a voice input portion 3103, operation switches 3104, a battery 3105 and an image receiving portion 3106. The present invention can be applied to the display is portion 3102.

Figure 26C:
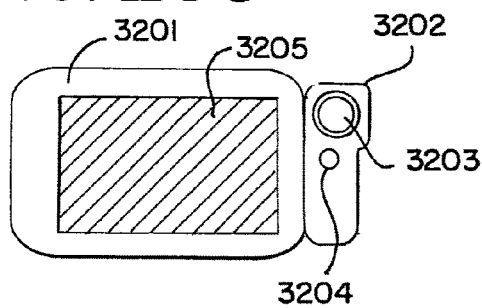
Figure 26D:
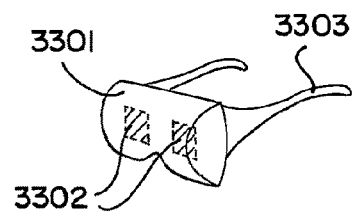

FIG. 26C shows a mobile computer including a main body 3201, a camera portion 3202, an image receiving portion 3203, an operation switch 3204 and a display portion 3205. The present invention can be applied to the display portion 3205.

FIG. 12D shows a goggle type display including a main body 3301, a display portion 3302 and an arm portion 3303. The present invention can be applied to the display portion 3302.

Figure 26E:
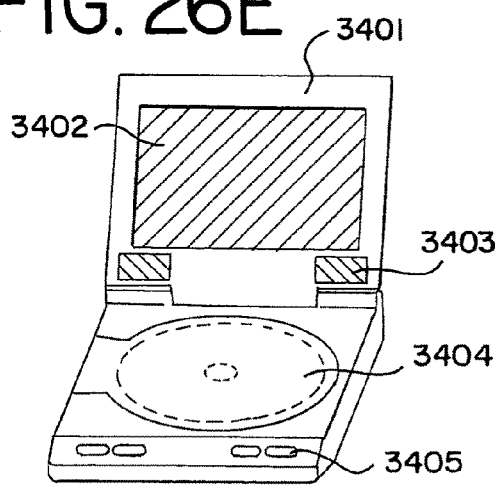

FIG. 26E shows a player using a recording medium recorded with programs (hereinafter, referred to as recording medium) including a main body 3401, a display portion 3402, a speaker portion 3403, a record medium 3404 and an operation switch 3405. The player uses DVD (Digital Versatile Disc) or CD as the record medium and can enjoy music, enjoy movie and carry out game or Internet. The present invention can be applied to the display portion 3402.

Figure 26F:
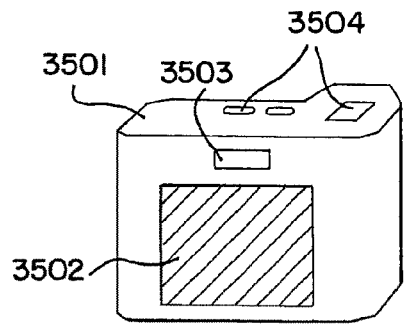

FIG. 26F shows a digital camera including a main body 3501, a display portion 3502, a viewfinder 3503, operation switches 3504 and an image receiving portion (not illustrated). The present invention can be applied to the display portion 3502.

Figure 27A:
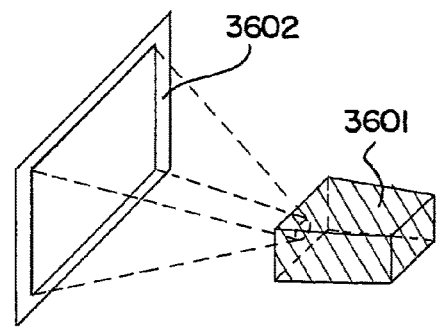
FIGS. 27A to 27D are diagrams showing examples of semiconductor device.

FIG. 27A shows a front type projector including a projection device 3601 and a screen 3602. The present invention can be applied to the liquid crystal display device 3808, which comprises a part of the projection device 3601, and other driver circuits.

Figure 27B:
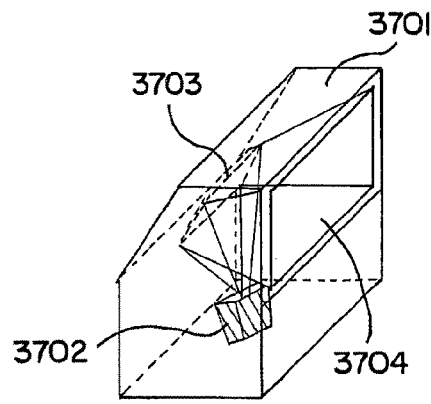

FIG. 27B shows a rear type projector including a main body 3701, a projection device 3702, a mirror 3703 and a screen 3704. The present invention can be applied to the liquid crystal display device 3808, which comprises a part of the projection device 3702, and other driver circuits.

Figure 27C:
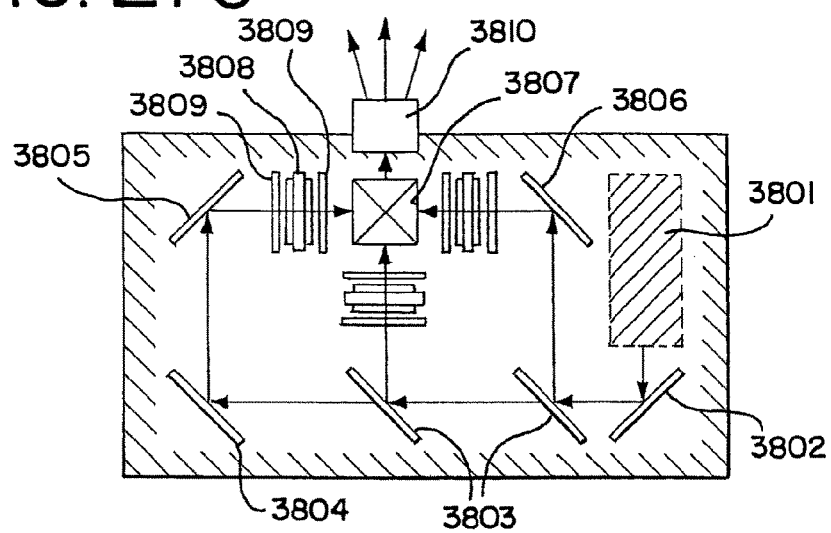

Further, FIG. 27C is a view showing an example of a structure of the projection apparatus 3601 and 3702 in FIG. 27A and FIG. 27B. The projection apparatus 3601 or 3702 is constituted by a light source optical system 3801, mirrors 3802, and 3804 through 3806, a dichroic mirror 3803, a prism 3807, a liquid crystal display device 3808, a phase difference plate 3809 and a projection optical system 3810. The projection optical system 3810 is constituted by an optical system including a projection lens. Although this embodiment shows an example of three plates type, this embodiment is not particularly limited thereto but may be of, for example, a single plate type. Further, person of executing this embodiment may pertinently provide an optical system such as an optical lens, a film having a polarization function, a film for adjusting a phase difference or an IR film in an optical path shown by arrow marks in FIG. 27C.

Figure 27D:
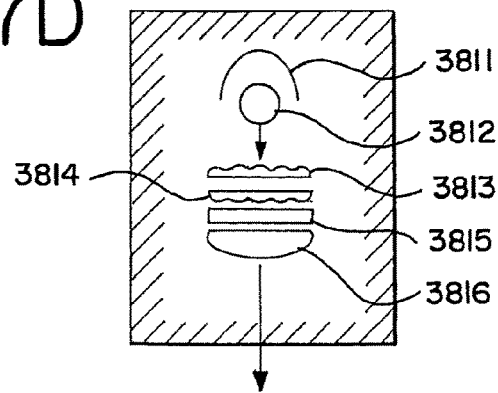

Further, FIG. 27D is a view showing an example of a structure of the light source optical system 3801 in FIG. 27C. According to this embodiment, the light source optical system 3801 is constituted by a reflector 3811, a light source 3812, lens arrays 3813 and 3814, a polarization conversion element 3815 and a focusing lens 3816. Further, the light source optical system shown in FIG. 27D is only an example and this embodiment is not particularly limited thereto. For example, person of executing this embodiment may pertinently provide an optical system such as an optical lens, a film having a polarization function, a film for adjusting a phase difference or an IR film in the light source optical system.

However, according to the projectors shown in FIG. 27, there is shown a case of using a transmission type electro-optical device and an example of applying a reflection type electro-optical device and a light emitting device are not illustrated.

Figure 28A:
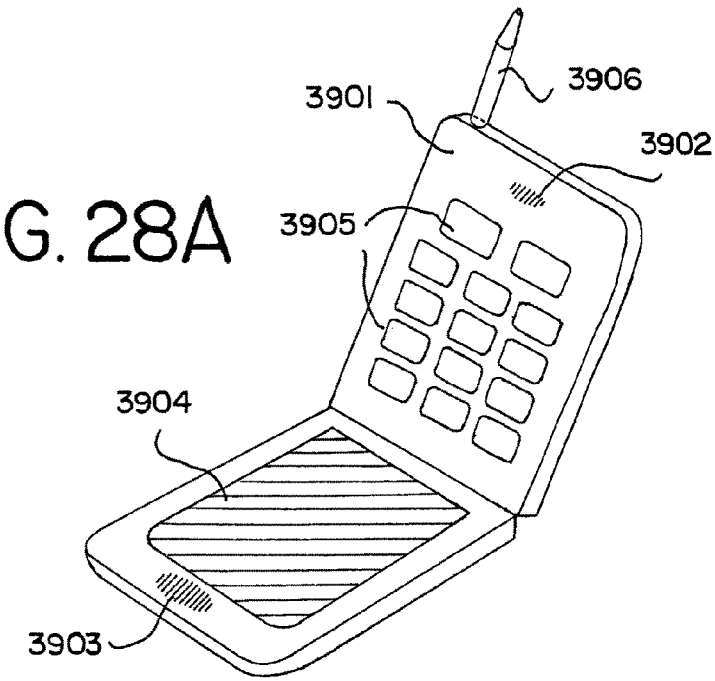
FIGS. 28A to 28C are diagrams showing examples of semiconductor device.

FIG. 28A shows a cellular phone including a main body 3901, a voice output portion 3902, a voice input portion 3903, a display portion 3904, an operation switch 3905 and an antenna 3906. The present invention can be applied to the display portion 3904.

Figure 28B:
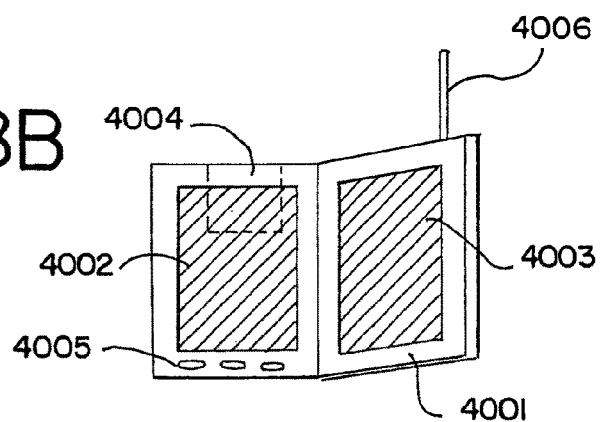

FIG. 28B shows a portable book (electronic book) including a main body 4001, display portions 4002 and 4003, a record medium 4004, an operation switch 4005 and an antenna 4006. The present invention can be applied to the display portions 4002 and 4003.

Figure 28C:
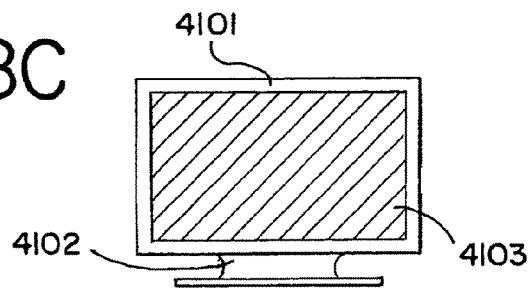

FIG. 28C shows a display including a main body 4101, a support base 4102 and a display portion 4103. The invention can be applied to the display portion 4103. The invention is particularly advantageous to a large-screen display, and is advantageous to a display having a diagonal size of 10 inches or more (particularly, 30 inches or more).

As has been described, the range of applying the invention is extremely wide and is applicable to electronic apparatus of all the fields. The electronic apparatus of this embodiment can be implemented by freely combined with Embodiment Modes 1, 2, Embodiments 1 to 3 and Embodiment 5.

By employing the structures of the present invention, basic usefulness as listed below are obtained.

(a) A simple method is provided which is compatible with conventional process of manufacturing a wiring or wiring substrate.

(b) A wiring having a desired taper angle can be formed by changing the bias power density, the ICP power density, the lower electrode temperature, or the ratio of chlorine in etching gas.

(c) A fluctuation throughout a substrate surface can be reduced by setting the pressure, the total flow rate of etching gas, the ratio of oxygen in etching gas, and the lower electrode temperature to given values.

(d) A metal wiring or metal wiring substrate suitable for a substrate of large size is obtained while the above advantages are fulfilled.

What is claimed is:

1. A method of manufacturing a semiconductor device comprising steps of:

forming a transistor on a substrate, the transistor comprising an active region and a gate electrode with a gate insulating film interposed therebetween;

forming an interlayer insulating film over the transistor;

forming a contact hole in the interlayer insulating film;

forming a metal wiring on the interlayer insulating film, the metal wiring being electrically connected to the active region via the contact hole, wherein the metal wiring has a taper portion at an edge portion thereof by using an ICP etching device, wherein reaction gases including $CF_4$, $Cl_2$, and $O_2$ are used in the ICP etching device, and wherein a temperature of a lower electrode of the ICP etching device is set to 85 to 120° C.

2. The method according to claim 1, wherein the metal wiring is selected from the group consisting of a tungsten film, a metal compound film with a tungsten compound as its main ingredient, a metal alloy film with a tungsten alloy as its main ingredient, an aluminum film, a metal compound film with an aluminum compound as its main ingredient, and a metal alloy film with an aluminum alloy as its main ingredient.

3. The method according to claim 1, wherein a taper angle of the taper portion is controlled in accordance with a bias power density of the ICP etching device.

4. The method according to claim 1, wherein a taper angle of the taper portion is controlled in accordance with an ICP power density of the ICP etching device.

5. The method according to claim 1, wherein a taper angle of the taper portion is controlled in accordance with a pressure in the ICP etching device.

6. The method according to claim 5, wherein the pressure is set to 2 to 13 Pa.

7. The method according to claim 1, wherein a taper angle of the taper portion is controlled in accordance with a flow rate of the reaction gases in the ICP etching device.

8. The method according to claim 7, wherein a total flow rate of the reaction gases is set to $2 \times 10^3$ to $11 \times 10^3$ sccm/m$^3$.

9. The method according to claim 1, wherein a taper angle of the taper portion is controlled in accordance with a ratio of oxygen in the reaction gases in the ICP etching device.

10. The method according to claim 9, wherein the ratio of oxygen in the reaction gases is set to 17 to 50%.

11. The method according to claim 1, wherein a taper angle of the taper portion is controlled in accordance with a ratio of chlorine in the reaction gases in the ICP etching device.

12. A method of manufacturing a semiconductor device comprising steps of:

forming a gate insulating film on a semiconductor substrate;

forming a gate electrode on the gate insulating film;

forming impurity regions in the semiconductor substrate, forming an interlayer insulating film over the gate electrode and the impurity regions;

forming a contact hole in the interlayer insulating film;

forming a metal wiring on the interlayer insulating film, the metal wiring being electrically connected to at least one of the impurity regions via the contact hole, wherein the metal wiring has a taper portion at an edge portion thereof by using an ICP etching device, wherein reaction gases including $CF_4$, $Cl_2$, and $O_2$ are used in the ICP etching device, and wherein a temperature of a lower electrode of the ICP etching device is set to 85 to 120° C.

13. The method according to claim 12, wherein the metal wiring is selected from the group consisting of a tungsten film, a metal compound film with a tungsten compound as its main ingredient, a metal alloy film with a tungsten alloy as its main ingredient, an aluminum film, a metal compound film with an aluminum compound as its main ingredient, and a metal alloy film with an aluminum alloy as its main ingredient.

14. The method according to claim 12, wherein a taper angle of the taper portion is controlled in accordance with a bias power density of the ICP etching device.

15. The method according to claim 12, wherein a taper angle of the taper portion is controlled in accordance with an ICP power density of the ICP etching device.

16. The method according to claim 12, wherein a taper angle of the taper portion is controlled in accordance with a pressure in the ICP etching device.

17. The method according to claim 16, wherein the pressure is set to 2 to 13 Pa.

18. The method according to claim 12, wherein a taper angle of the taper portion is controlled in accordance with a flow rate of the reaction gases in the ICP etching device.

19. The method according to claim 18, wherein a total flow rate of the reaction gases is set to $2 \times 10^3$ to $11 \times 10^3$ sccm/m$^3$.

20. The method according to claim 12, wherein a taper angle of the taper portion is controlled in accordance with a ratio of oxygen in the reaction gases in the ICP etching device.

21. The method according to claim 20, wherein the ratio of oxygen in the reaction gases is set to 17 to 50%.

22. The method according to claim 12, wherein a taper angle of the taper portion is controlled in accordance with a ratio of chlorine in the reaction gases in the ICP etching device.

* * * * *